US011621201B2

(12) United States Patent
Ueki et al.

(10) Patent No.: US 11,621,201 B2
(45) Date of Patent: Apr. 4, 2023

(54) LASER BEAM SPOT SHAPE CORRECTING METHOD

(71) Applicant: DISCO CORPORATION, Tokyo (JP)

(72) Inventors: Atsushi Ueki, Tokyo (JP); Teppei Nomura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 276 days.

(21) Appl. No.: 17/113,548

(22) Filed: Dec. 7, 2020

(65) Prior Publication Data

US 2021/0183714 A1    Jun. 17, 2021

(30) Foreign Application Priority Data

Dec. 11, 2019   (JP) .............................. JP2019-224048

(51) Int. Cl.
*H01L 21/67* (2006.01)
*H01L 21/66* (2006.01)
(Continued)

(52) U.S. Cl.
CPC ............ *H01L 22/20* (2013.01); *B23K 26/032* (2013.01); *B23K 26/073* (2013.01); *B23K 26/53* (2015.10);
(Continued)

(58) Field of Classification Search
CPC . H01L 22/20; H01L 21/268; H01L 21/67092; H01L 21/67115; H01L 21/67253; H01L 21/78; B23K 26/032; B23K 26/073; B23K 26/53; B23K 2103/56; B23K 26/03; B23K 26/70; B23K 26/705; B23K 26/064; B23K 26/042; B23K 26/0643; B23K 26/0648; G02B 5/10; G02B 19/0009; G02B 19/0085; G02B 27/0068;
(Continued)

(56) References Cited

U.S. PATENT DOCUMENTS 6,433,839 B1 *  8/2002  Siefken ................... G06T 13/00
                                                         348/700
6,911,347 B2 *  6/2005  Higgs ..................... G01N 21/94
                                                         438/16
(Continued)

FOREIGN PATENT DOCUMENTS

JP    2002192370 A    7/2002
JP    2016041437 A    3/2016

OTHER PUBLICATIONS

Search Report issued in the counterpart Singapore patent application No. 10202011979Y, dated Dec. 27, 2021.

*Primary Examiner* — Vu A Vu
(74) *Attorney, Agent, or Firm* — Greer Burns & Crain Ltd.

(57) ABSTRACT

A laser beam spot shape correcting method includes a laser beam irradiating step of irradiating a concave mirror with a laser beam, an imaging step of imaging reflected light by a beam profiler, an image forming step of forming an XZ plane image or a YZ plane image from an XY plane image imaged in the imaging step, and a comparing step of comparing the image formed in the image forming step with an XZ plane image or a YZ plane image of an ideal laser beam. A phase pattern displayed on a display unit of a spatial light modulator is changed such that the XZ plane image or the YZ plane image formed in the image forming step coincides with the XZ plane image or the YZ plane image of the ideal laser beam.

7 Claims, 20 Drawing Sheets

(51) Int. Cl.
  *G02B 19/00*    (2006.01)
  *G02B 27/09*    (2006.01)
  *G02B 27/00*    (2006.01)
  *G02B 5/10*     (2006.01)
  *H01L 21/268*   (2006.01)
  *H01L 21/78*    (2006.01)
  *B23K 26/03*    (2006.01)
  *B23K 26/073*   (2006.01)
  *B23K 26/53*    (2014.01)
  *B23K 103/00*   (2006.01)
  *G02F 1/1362*   (2006.01)

(52) U.S. Cl.
  CPC ........... *G02B 5/10* (2013.01); *G02B 19/0009* (2013.01); *G02B 19/0085* (2013.01); *G02B 27/0068* (2013.01); *G02B 27/0927* (2013.01); *H01L 21/268* (2013.01); *H01L 21/67092* (2013.01); *H01L 21/67115* (2013.01); *H01L 21/67253* (2013.01); *H01L 21/78* (2013.01); *B23K 2103/56* (2018.08); *G02F 1/136277* (2013.01); *G02F 2203/12* (2013.01); *G02F 2203/50* (2013.01)

(58) Field of Classification Search
  CPC ............ G02B 27/0927; G02B 26/0816; G02B 19/0028; G02B 27/0944; G02B 19/0052; G02F 1/136277; G02F 2203/12; G02F 2203/50; B23Q 3/06
  USPC ............................................................ 438/5
  See application file for complete search history.

(56) References Cited

U.S. PATENT DOCUMENTS

| | | | |
|---|---|---|---|
| 9,921,152 B2 * | 3/2018 | Krishnan | G01N 21/3563 |
| 9,952,140 B2 * | 4/2018 | Wang | G03F 7/70625 |
| 10,072,921 B2 * | 9/2018 | Fu | G03F 7/00 |
| 10,635,004 B2 * | 4/2020 | Jiang | G03F 7/70508 |
| 2012/0206786 A1 | 8/2012 | Ito et al. | |
| 2016/0045980 A1 | 2/2016 | Asano et al. | |

\* cited by examiner

LASER BEAM SPOT SHAPE CORRECTING METHOD

BACKGROUND OF THE INVENTION

Field of the Invention

The present invention relates to a laser beam spot shape correcting method.

Description of the Related Art

As a technology for dividing a plate-shaped object (plate-shaped workpiece) such as a semiconductor wafer into a chip size, a technology is known which forms a modified layer serving as a division starting point by positioning a focal point of a laser beam within the workpiece and applying the laser beam along planned dividing lines (see Japanese Patent No. 3408805, for example).

However, various optical parts are used in an optical system of a laser processing apparatus that performs laser processing as described above, and various optical distortions may occur on an optical path of the optical system. The optical distortions may cause a processing result to differ between processing apparatuses, that is, cause a so-called machine difference between apparatuses.

In order to solve this problem, a technology has been proposed which grasps a spot shape at a processing point by holding a concave mirror by a chuck table and imaging light reflected from the concave mirror (see Japanese Patent Laid-Open No. 2016-41437, for example).

SUMMARY OF THE INVENTION

However, the technology illustrated in Japanese Patent Laid-Open No. 2016-41437 does not identify a position where an optical distortion occurs in a plurality of optical elements constituting the optical system even when the spot shape can be grasped. Thus, work of identifying the position of the distortion is needed, and it takes time to correct the spot shape.

It is accordingly an object of the present invention to provide a laser beam spot shape correcting method that can suppress the number of man-hours necessary to correct the spot shape of a laser beam, and can reduce a machine difference between processing apparatuses in terms of the laser beam applied to a workpiece.

In accordance with an aspect of the present invention, there is provided a laser beam spot shape correcting method for correcting a spot shape of a laser beam condensed by a condensing lens in a laser processing apparatus. The laser processing apparatus includes a chuck table configured to hold a workpiece, a laser beam irradiating unit configured to irradiate the workpiece held on the chuck table with the laser beam, and a control unit. The laser beam irradiating unit includes a laser oscillator, the condensing lens configured to condense the laser beam emitted from the laser oscillator, and a spatial light modulator disposed between the laser oscillator and the condensing lens. The method includes a concave mirror disposing step of positioning a concave mirror having a reflecting surface as a spherical surface at a position facing the condensing lens of the laser beam irradiating unit, a focal point positioning step of positioning a condensing point of the condensing lens at a focal point position of the concave mirror after the concave mirror disposing step, a laser beam irradiating step of irradiating the concave mirror with the laser beam condensed by the condensing lens by actuating the laser oscillator, an imaging step of imaging reflected light reflected by the reflecting surface of the concave mirror by an imaging unit, an image forming step of forming an XZ plane image or a YZ plane image from an XY plane image depicting a shape and an intensity distribution of the laser beam imaged in the imaging step, and a comparing step of comparing the image formed in the image forming step with an XZ plane image or a YZ plane image of a laser beam having an ideal shape and an ideal intensity distribution. A phase pattern displayed on a display unit of the spatial light modulator is changed such that the XZ plane image or the YZ plane image formed in the image forming step coincides with the XZ plane image or the YZ plane image of the laser beam having the ideal shape and the ideal intensity distribution.

Preferably, the laser beam spot shape correcting method further includes a determining step of determining which aberration component is included in the image of the laser beam imaged in the imaging step. A phase pattern that cancels out the aberration component determined in the determining step is displayed on the display unit of the spatial light modulator.

Preferably, the laser beam spot shape correcting method further includes a determining step of determining which aberration component is included in the laser beam imaged in the imaging step, and a storing step of storing, in advance, which aberration component is included in the laser beam having the ideal shape and the ideal intensity distribution, in which the phase pattern displayed on the display unit of the spatial light modulator is changed such that the aberration component of the laser beam imaged in the imaging step coincides with the aberration component of the ideal laser beam.

Preferably, in the comparing step, when a difference between the compared images is equal to or less than a predetermined rate, the difference is determined to be acceptable, and when the difference is larger than the predetermined rate, the spot shape is corrected again.

The invention of the present application produces effects of being able to suppress the number of man-hours necessary to correct the spot shape of a laser beam and being able to reduce a machine difference between processing apparatuses in terms of the laser beam applied to a workpiece.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

An embodiment of the present invention will hereinafter be described in detail with reference to the drawings. The present invention is not limited by contents described in the following embodiment. In addition, constituent elements described in the following include constituent elements readily conceivable by those skilled in the art and essentially identical constituent elements. Further, configurations described in the following can be combined with each other as appropriate. In addition, various omissions, replacements, or modifications of configurations can be performed without departing from the spirit of the present invention.

First Embodiment

Figure 1:
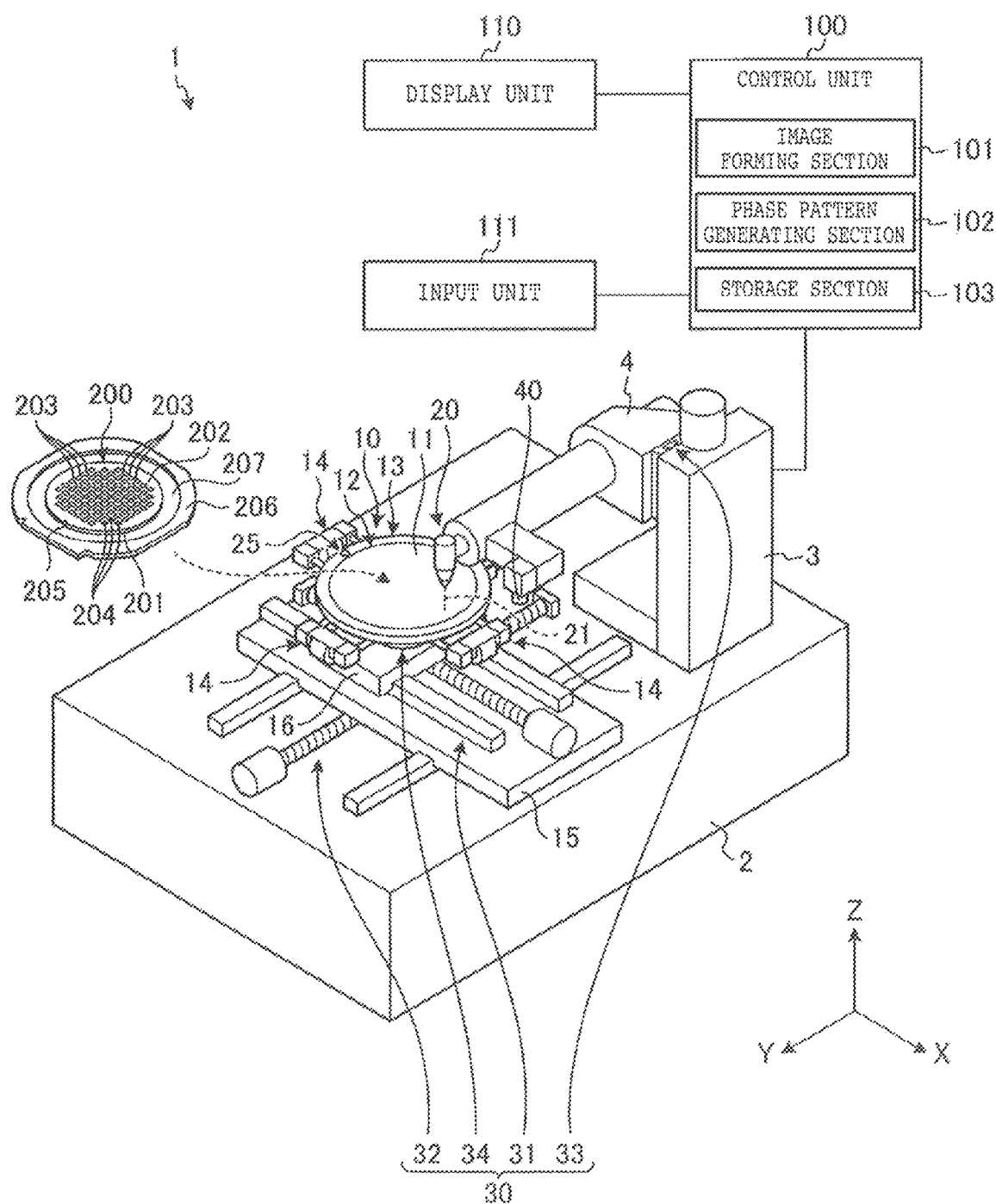
FIG. 1 is a perspective view depicting an example of a configuration of a laser processing apparatus that performs a laser beam spot shape correcting method according to a first embodiment.

A laser beam spot shape correcting method according to a first embodiment of the present invention will be described with reference to the drawings. First, description will be made of a configuration of a laser processing apparatus 1 that performs the laser beam spot shape correcting method according to the first embodiment. FIG. 1 is a perspective view depicting an example of a configuration of a laser processing apparatus that performs the laser beam spot shape correcting method according to the first embodiment. The laser processing apparatus 1 depicted in FIG. 1 according to the first embodiment is an apparatus that laser-processes a workpiece 200 by irradiating the workpiece 200 with a pulsed laser beam 21.

The workpiece 200 to be processed by the laser processing apparatus 1 depicted in FIG. 1 is a wafer such as a semiconductor wafer, or an optical device wafer in a disk shape which wafer has a substrate 201 of silicon, sapphire, gallium arsenide, or the like. As depicted in FIG. 1, the workpiece 200 has planned dividing lines 203 set in a lattice manner on a top surface 202 of the substrate 201 and devices 204 formed in regions demarcated by the planned dividing lines 203. The devices 204 are, for example, an integrated circuit such as an integrated circuit (IC), or a large scale integration (LSI), or an image sensor such as a charge coupled device (CCD) image sensor, or a complementary metal oxide semiconductor (CMOS) image sensor.

In the first embodiment, the workpiece 200 is supported within an opening of an annular frame 206 in a state in which an adhesive tape 207 having a disk shape of a larger diameter than the outside diameter of the workpiece 200 and having the annular frame 206 affixed to an outer edge portion thereof is affixed to an undersurface 205 on the underside of the top surface 202. In the first embodiment, the workpiece 200 is divided into individual devices 204 along the planned dividing lines 203.

(Laser Processing Apparatus)

As depicted in FIG. 1, the laser processing apparatus 1 includes a chuck table 10 as a chuck table holding the workpiece 200 by a holding surface 11, a laser beam irradiating unit 20 as a laser beam irradiating unit, a moving unit 30, an imaging unit 40, and a control unit 100.

The chuck table 10 holds the workpiece 200 by the holding surface 11. The chuck table 10 is of a disk shape including a disk-shaped suction portion 12 in which the flat holding surface 11 holding the workpiece 200 is formed as an upper surface and which is formed of a porous ceramic or the like having a large number of porous holes, and a frame body 13 that fixes the suction portion 12 in a state in which the suction portion 12 is fitted in a recess in the center of the upper surface. The upper surface of the frame body 13 is located on a same plane as the holding surface 11 and is a circumferential edge portion of the chuck table 10 in the first embodiment. The suction portion 12 of the chuck table 10 is connected to a vacuum suction source not depicted via a vacuum suction path not depicted. The chuck table 10 sucks and holds the workpiece 200 mounted on the holding surface 11. In the first embodiment, the holding surface 11 is a flat surface parallel with a horizontal direction. A plurality of clamp units 14 that sandwich the annular frame 206 supporting the workpiece 200 within the opening thereof are arranged on the periphery of the chuck table 10.

In addition, the chuck table 10 is rotated about an axis parallel with a Z-axis direction by a rotary moving unit 34 of the moving unit 30. Incidentally, the Z-axis direction is a direction orthogonal to the holding surface 11 and parallel with a vertical direction. The chuck table 10 is moved in an X-axis direction parallel with the horizontal direction by an X-axis moving unit 31 of the moving unit 30 and moved in a Y-axis direction parallel with the horizontal direction and orthogonal to the X-axis direction by a Y-axis moving unit 32 together with the rotary moving unit 34.

The laser beam irradiating unit 20 is a laser beam irradiating unit that forms a modified layer as a fracture starting point within the workpiece 200 by irradiating the workpiece 200 held on the chuck table 10 with the pulsed laser beam 21 of a wavelength transmissible by the workpiece 200. The modified layer refers to a region in which density, an index of refraction, mechanical strength, or another physical property is different from that of surroundings. The modified layer is, for example, a melted region, a crack region, a dielectric breakdown region, a refractive index change region, a region in which these regions are mixed, and the like. In the embodiment, the modified layer has a lower mechanical strength than other parts of the substrate 201.

Incidentally, while the laser beam irradiating unit 20 in the first embodiment irradiates the workpiece 200 with the laser beam 21 of a wavelength transmissible by the workpiece 200, the laser beam irradiating unit 20 in the present invention may subject the workpiece 200 to ablation processing by applying a laser beam 21 of a wavelength absorbable by the workpiece 200. In the first embodiment, as depicted in FIG. 1, a part of the laser beam irradiating unit 20 is supported by a raising and lowering member 4 moved in the Z-axis direction by a Z-axis moving unit 33 of the moving unit 30, the Z-axis moving unit 33 being provided to an erected wall 3 erected from an apparatus main body 2. Incidentally, a configuration and the like of the laser beam irradiating unit 20 will be described later.

The moving unit 30 moves the chuck table 10 and the laser beam irradiating unit 20 relative to each other in the X-axis direction, the Y-axis direction, and the Z-axis direction. Incidentally, the X-axis direction and the Y-axis direction are directions parallel with the holding surface 11. The moving unit 30 includes the X-axis moving unit 31 as processing feeding means for moving the chuck table 10 in the X-axis direction, the Y-axis moving unit 32 as indexing feeding means for moving the chuck table 10 in the Y-axis direction, the Z-axis moving unit 33 that moves a condensing lens 23 included in the laser beam irradiating unit 20 in the Z-axis direction, and the rotary moving unit 34 that rotates the chuck table 10 about an axis parallel with the Z-axis direction.

In the first embodiment, the Y-axis moving unit 32 is installed on the apparatus main body 2 of the laser processing apparatus 1. The Y-axis moving unit 32 supports a moving plate 15 supporting the X-axis moving unit 31 such that the moving plate 15 is movable in the Y-axis direction. The X-axis moving unit 31 is installed on the moving plate 15. The X-axis moving unit 31 supports a second moving plate 16 supporting the rotary moving unit 34 that rotates the chuck table 10 about an axis parallel with the Z-axis direction such that the second moving plate 16 is movable in the X-axis direction. The Z-axis moving unit 33 is installed on the erected wall 3. The Z-axis moving unit 33 supports the raising and lowering member 4 movably in the Z-axis direction.

The X-axis moving unit 31, the Y-axis moving unit 32, and the Z-axis moving unit 33 include well-known ball screws provided rotatably about axes, well-known pulse motors rotating the ball screws about the axes, and well-known guide rails supporting the moving plates 15 and 16 movably in the X-axis direction or the Y-axis direction and supporting the raising and lowering member 4 movably in the Z-axis direction.

In addition, the laser processing apparatus 1 includes an X-axis direction position detecting unit not depicted for detecting the position in the X-axis direction of the chuck table 10, a Y-axis direction position detecting unit not depicted for detecting the position in the Y-axis direction of the chuck table 10, and a Z-axis direction position detecting unit for detecting the position in the Z-axis direction of the condensing lens 23 included in the laser beam irradiating unit 20. Each of the position detecting units outputs a detection result to the control unit 100.

The imaging unit 40 images the workpiece 200 held on the chuck table 10. The imaging unit 40 includes an imaging element such as a CCD imaging element, or a CMOS imaging element that images the workpiece 200 held on the chuck table 10. In the first embodiment, the imaging unit 40 is attached to an end of a casing of the laser beam irradiating unit 20, and is disposed at a position aligned in the X-axis direction with the condensing lens 23 depicted in FIG. 2 in the laser beam irradiating unit 20. The imaging unit 40 images the workpiece 200, thereby obtains an image for carrying out alignment that aligns the workpiece 200 and the laser beam irradiating unit 20 with each other, and then outputs the obtained image to the control unit 100.

The control unit 100 makes processing operation on the workpiece 200 performed by the laser processing apparatus 1 by controlling each of the above-described constituent elements of the laser processing apparatus 1. Incidentally, the control unit 100 is a computer including an arithmetic processing unit having a microprocessor such as a central processing unit (CPU), a storage unit having a memory such as a read only memory (ROM) or a random access memory (RAM), and an input-output interface unit. The arithmetic processing unit of the control unit 100 implements functions of the control unit 100 by performing arithmetic processing according to a computer program stored in the storage unit, and outputting control signals for controlling the laser processing apparatus 1 to the above-described constituent elements of the laser processing apparatus 1 via the input-output interface unit.

In addition, the laser processing apparatus 1 includes a display unit 110 formed by a liquid crystal display device or the like that displays a state of processing operation, an image, or the like, and an input unit 111 used when an operator registers processing content information or the like. The display unit 110 and the input unit 111 are connected to the control unit 100. The input unit 111 is formed by at least one of a touch panel provided to the display unit 110 and an external input device such as a keyboard.

Figure 2:
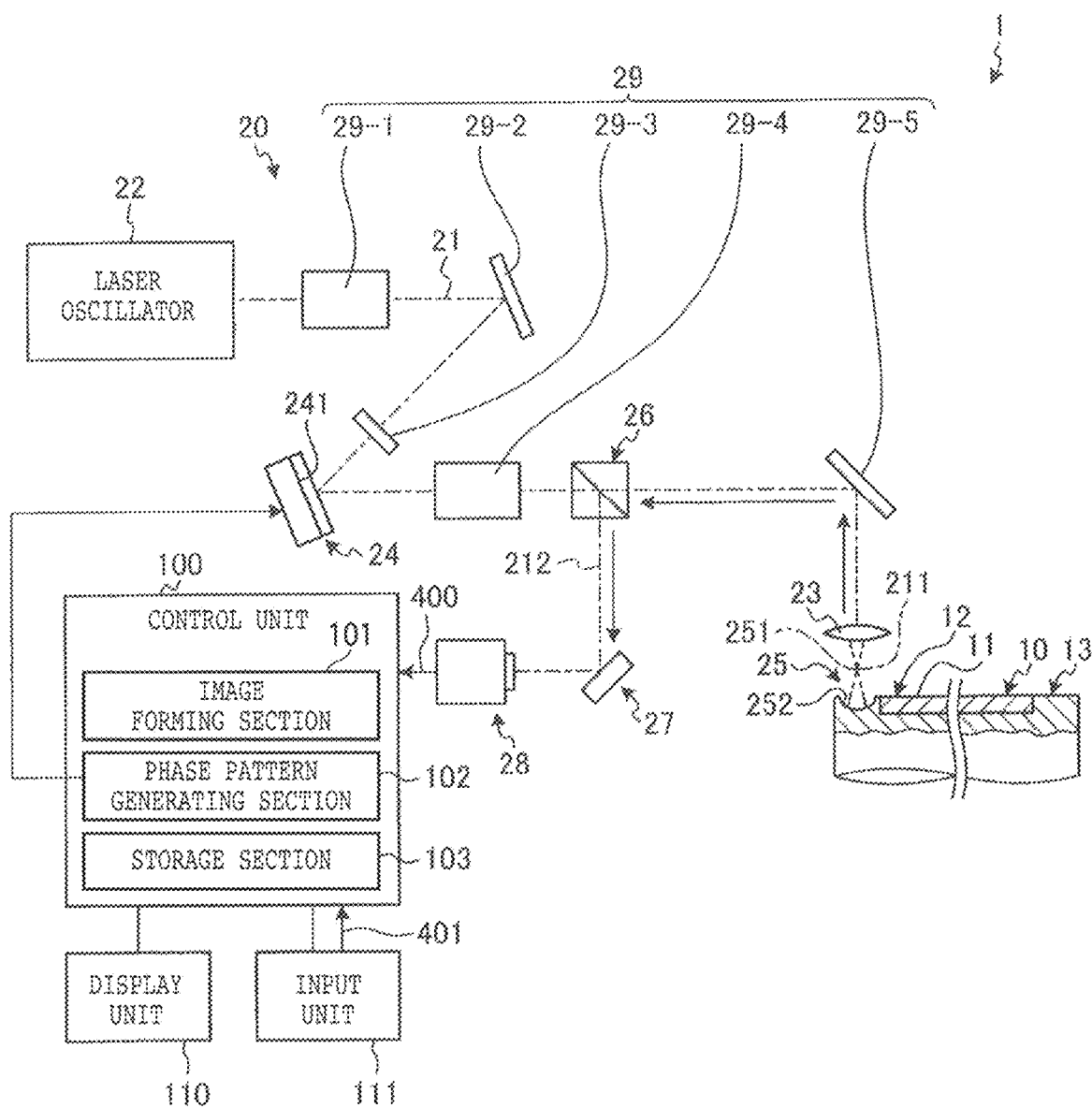
FIG. 2 is a schematic diagram depicting a configuration of a laser beam irradiating unit of the laser processing apparatus depicted in FIG. 1.
Figure 3:
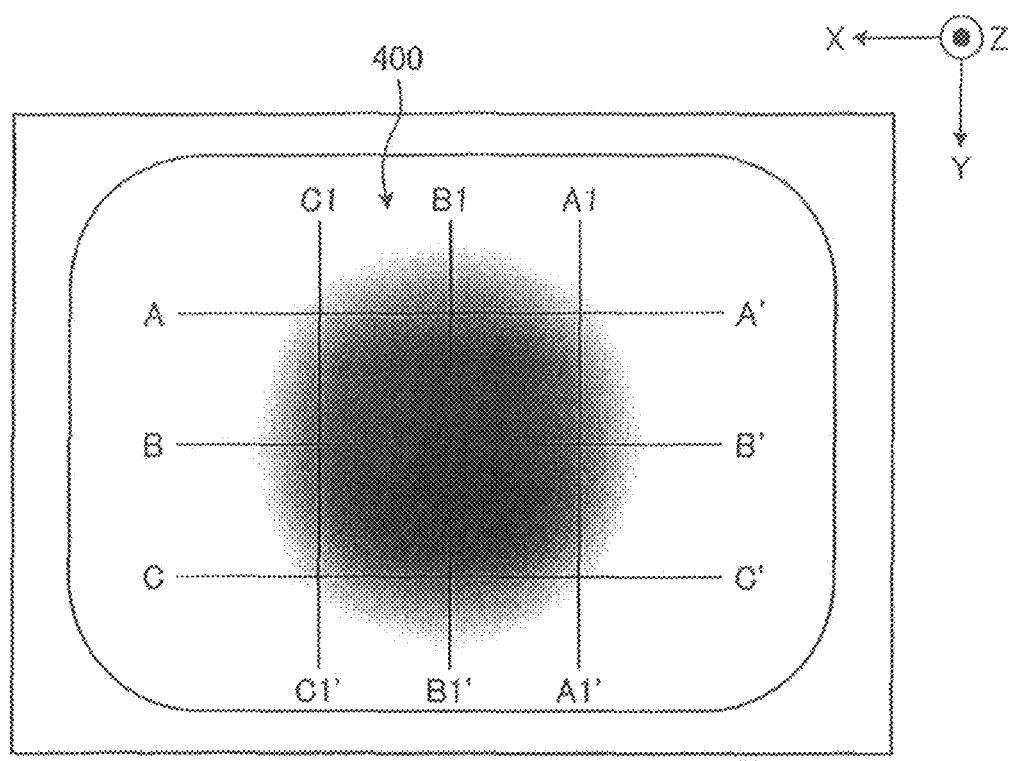
FIG. 3 is a schematic diagram of an XY plane image depicting the shape and intensity distribution of reflected light of a laser beam, the XY plane image being obtained by a beam profiler of the laser processing apparatus depicted in FIG. 1 by imaging the reflected light.

The laser beam irradiating unit 20 will next be described. FIG. 2 is a diagram of assistance in explaining a configuration of the laser beam irradiating unit of the laser processing apparatus depicted in FIG. 1. FIG. 3 is a schematic diagram of an XY plane image depicting the shape and intensity distribution of reflected light of a laser beam, the XY plane image being obtained by a beam profiler of the laser processing apparatus depicted in FIG. 1 by imaging the reflected light. As depicted in FIG. 2, the laser beam irradiating unit 20 includes a laser oscillator 22 that oscillates a pulsed laser for processing the workpiece 200, the condensing lens 23 that condenses a laser beam 21 emitted from the laser oscillator 22 onto the workpiece 200 held on the holding surface 11 of the chuck table 10, a spatial light modulator 24, a concave mirror 25, a beam splitter 26 as branching means, attenuating means 27, a beam profiler 28 as an imaging unit, and a plurality of optical parts 29.

The condensing lens 23 is disposed at a position opposed in the Z-axis direction to the holding surface 11 of the chuck table 10. The condensing lens 23 transmits the laser beam 21 emitted from the laser oscillator 22 and condenses the laser beam 21 at a condensing point 211.

The spatial light modulator 24 is a so-called liquid crystal on silicon-spatial light modulator (LCOS-SLM) that is disposed on an optical path of the laser beam 21 between the laser oscillator 22 and the condensing lens 23, and adjusts the optical characteristic of the laser beam 21 emitted from the laser oscillator 22 and emits the laser beam 21 whose optical characteristic is adjusted. In the first embodiment, the spatial light modulator 24 is a modulator that reflects the laser beam 21 emitted from the laser oscillator 22. In the first embodiment, the optical characteristic of the laser beam 21 which optical characteristic is adjusted by the spatial light modulator 24 is, for example, at least one of the phase, plane of polarization, amplitude, intensity, and propagation direction of the laser beam 21.

In the first embodiment, the spatial light modulator 24 includes a display unit 241 irradiated with the laser beam 21 emitted from the laser oscillator 22 and adjusts the optical characteristic when reflecting the laser beam 21. The spatial light modulator 24 emits the laser beam 21 whose optical characteristic is adjusted by the display unit 241 toward the condensing lens 23 via the beam splitter 26 or the like. In addition, in the first embodiment, the display unit 241 of the spatial light modulator 24 displays a phase pattern for adjusting the optical characteristic of the laser beam 21, and adjusts the optical characteristic of the laser beam 21 by reflecting the laser beam 21. The phase pattern is controlled by the control unit 100. The spatial light modulator 24 adjusts the optical characteristic of the laser beam 21 to be emitted on the basis of the control of the phase pattern displayed on the display unit 241 by the control unit 100.

The concave mirror 25 includes a reflecting surface 252 that is disposed at a position opposable in the Z-axis direction to the condensing lens 23 and can be positioned so as to have a focal point 251 at the condensing point 211 of the condensing lens 23 when opposed in the Z-axis direction to the condensing lens 23. The reflecting surface 252 is a spherical surface and reflects the laser beam 21 emitted from the condensing lens 23 opposed in the Z-axis direction to the condensing lens 23. In the first embodiment, the concave mirror 25 is disposed in the frame body 13 of the chuck table 10, and the reflecting surface 252 is disposed at a position opposable in the Z-axis direction to the condensing lens 23. In the first embodiment, the focal point 251 of the reflecting surface 252 is positioned at the condensing point 211 of the condensing lens 23 by adjusting the position in the Z-axis direction of the condensing lens 23 by the Z-axis moving unit 33, so that the condensing point 211 of the condensing lens 23 is located at the focal point 251.

The beam splitter 26 passes, to the condensing lens 23, the laser beam 21 that is emitted from the laser oscillator 22 and whose optical characteristic is adjusted by the spatial light modulator 24. The beam splitter 26 reflects, to the attenuating means 27, reflected light 212 of the laser beam 21 condensed by the condensing lens 23, reflected by the reflecting surface 252 of the concave mirror 25, and passed through the condensing lens 23. The beam splitter 26 thereby branches the reflected light 212 from the laser beam 21.

The attenuating means 27 is to attenuate the intensity of the reflected light 212 reflected by the beam splitter 26. In the first embodiment, the attenuating means 27 attenuates the intensity of the reflected light 212 and reflects the reflected light 212 to the beam profiler 28. The attenuating means 27 is, for example, formed by a wedge substrate.

The beam profiler 28 images the reflected light 212 reflected by the reflecting surface 252 of the concave mirror 25, branched from the laser beam 21 by the beam splitter 26, and attenuated in intensity by the attenuating means 27, and thereby obtains an XY plane image 400 (depicted in FIG. 3) of the laser beam 21, the XY plane image 400 having (depicting) the shape and spatial intensity distribution of the reflected light 212 of the laser beam 21. The beam profiler 28 outputs the obtained XY plane image 400 to the control unit 100. Incidentally, the XY plane image 400 obtained by the beam profiler 28 indicates intensity at each position in the X-axis direction and the Y-axis direction of the reflected light 212.

The optical parts 29 propagate the laser beam 21 emitted from the laser oscillator 22 to a processing point at which the workpiece 200 is processed or the concave mirror 25, and propagate the reflected light 212 of the laser beam 21 reflected by the reflecting surface 252 of the concave mirror 25 to the beam profiler 28. In the first embodiment, the optical parts 29 include a beam expander 29-1, a reflecting mirror 29-2, and a wavelength plate 29-3 arranged on an optical path of the laser beam 21 between the laser oscillator 22 and the spatial light modulator 24. In the first embodiment, the beam expander 29-1, the reflecting mirror 29-2, and the wavelength plate 29-3 are arranged in order from the laser oscillator 22 to the spatial light modulator 24. The optical parts 29 also include a relay optical system 29-4 disposed on an optical path of the laser beam 21 between the spatial light modulator 24 and the beam splitter 26 and a reflecting mirror 29-5 disposed on an optical path of the laser beam 21 between the beam splitter 26 and the condensing lens 23.

Figure 4:
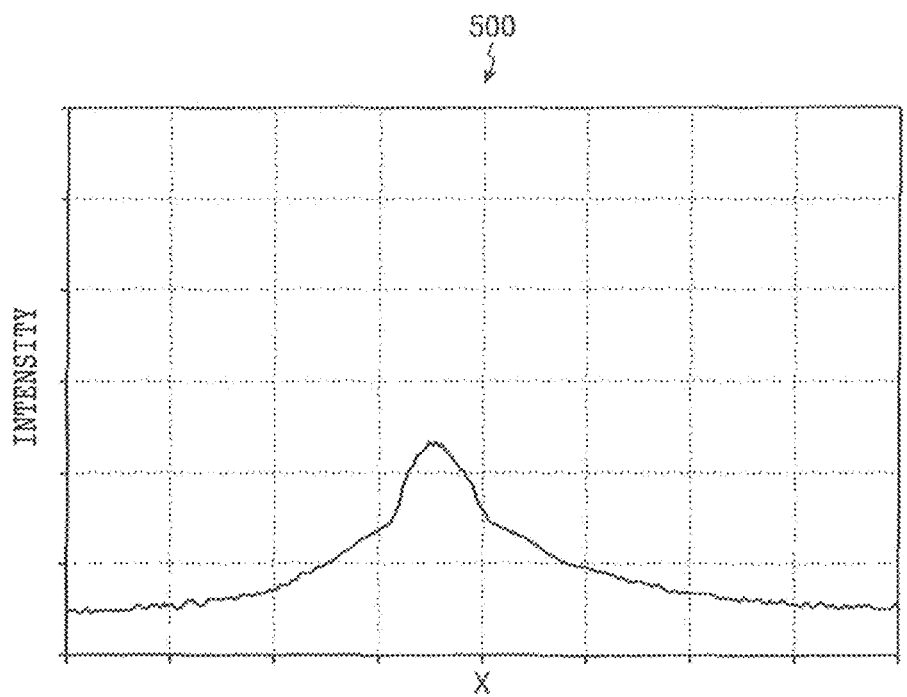
FIG. 4 is a diagram depicting an XZ plane image along a line A-A' in FIG. 3.
Figure 5:
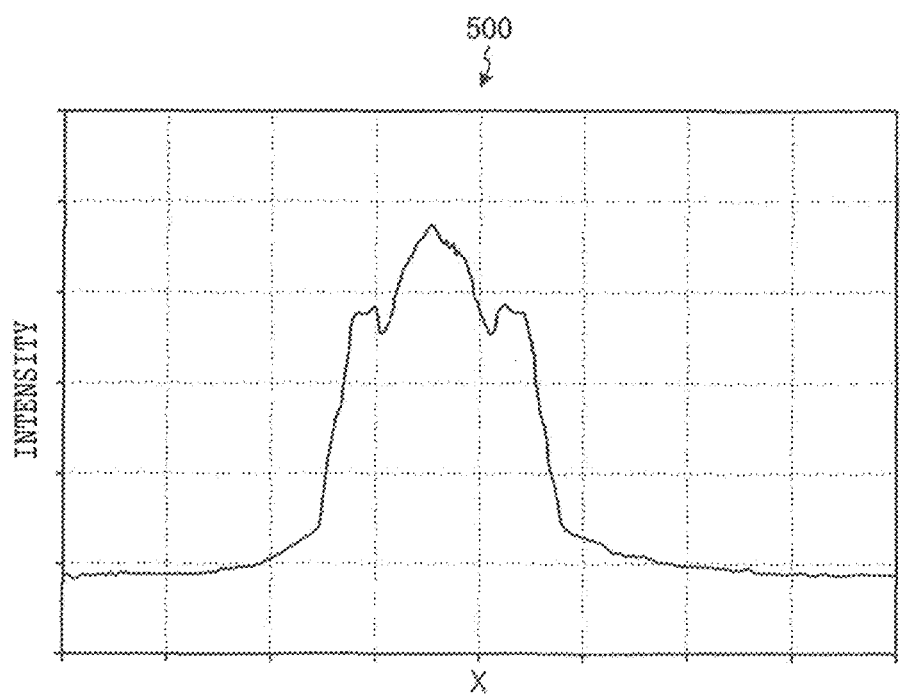
FIG. 5 is a diagram depicting an XZ plane image along a line B-B' in FIG. 3.
Figure 6:
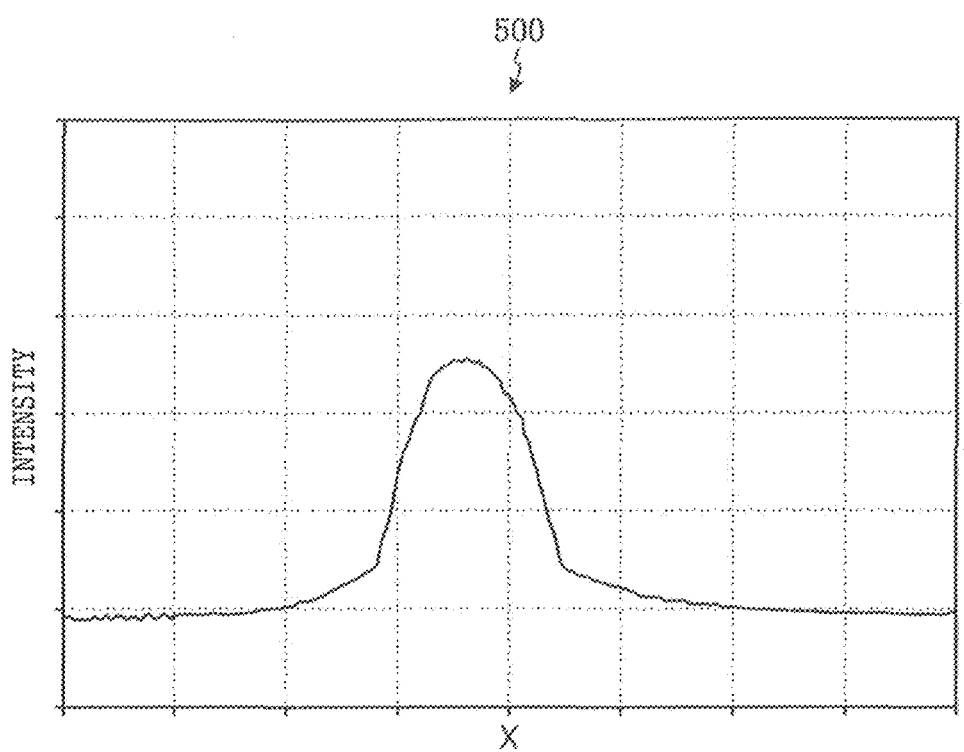
FIG. 6 is a diagram depicting an XZ plane image along a line C-C' in FIG. 3.
Figure 7:
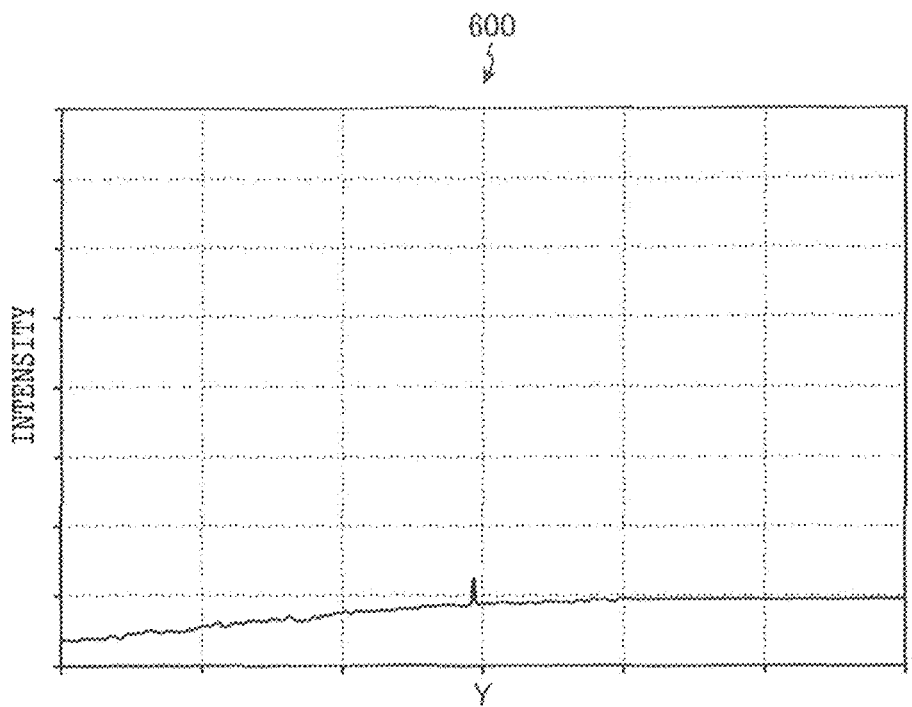
FIG. 7 is a diagram depicting a YZ plane image along a line A1-A1' in FIG. 3.
Figure 8:
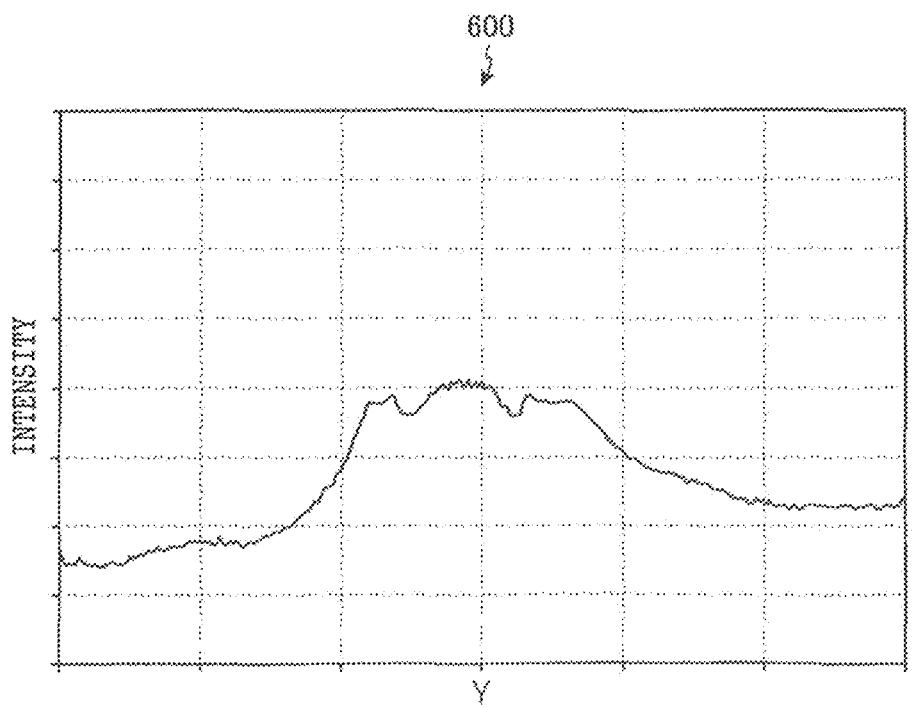
FIG. 8 is a diagram depicting a YZ plane image along a line B1-B1' in FIG. 3.
Figure 9:
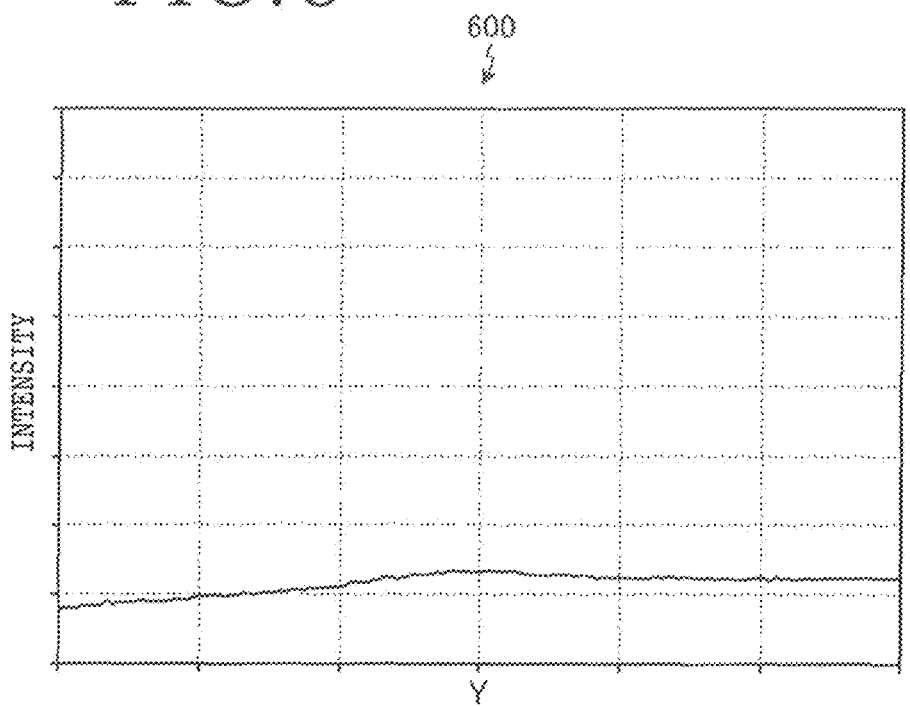
FIG. 9 is a diagram depicting a YZ plane image along a line C1-C1' in FIG. 3.

In addition, as depicted in FIG. 1, the control unit 100 of the laser processing apparatus 1 according to the first embodiment includes an image forming section 101, a phase pattern generating section 102, and a storage section 103. Each constituent element of the control unit 100 will next be described. FIG. 4 is a diagram depicting an XZ plane image along a line A-A' in FIG. 3. FIG. 5 is a diagram depicting an XZ plane image along a line B-B' in FIG. 3. FIG. 6 is a diagram depicting an XZ plane image along a line C-C' in FIG. 3. FIG. 7 is a diagram depicting a YZ plane image along a line A1-A1' in FIG. 3. FIG. 8 is a diagram depicting a YZ plane image along a line B1-B1' in FIG. 3. FIG. 9 is a diagram depicting a YZ plane image along a line C1-C1' in FIG. 3.

The image forming section 101 outputs the XY plane image 400 of the laser beam 21, the XY plane image 400 being obtained by the beam profiler 28 by imaging the reflected light 212 and having the shape and spatial intensity distribution of the reflected light 212 of the laser beam 21, to the display unit 110 to display the XY plane image 400 on the display unit 110.

In addition, the image forming section 101 forms an XZ plane image 500 examples of which are depicted in FIG. 4, FIG. 5, and FIG. 6 from the XY plane image 400 of the reflected light 212, and outputs the formed XZ plane image 500 to the display unit 110 to display the XZ plane image 500 on the display unit 110. Incidentally, the XZ plane image 500 is an image in a section of the reflected light 212 of the laser beam 21 which section is parallel with both the X-axis direction and the Z-axis direction. The image forming section 101 forms a YZ plane image 600 examples of which are depicted in FIG. 7, FIG. 8, and FIG. 9 from the XY plane image 400 of the reflected light 212, and outputs the formed YZ plane image 600 to the display unit 110 to display the YZ plane image 600 on the display unit 110. The YZ plane image 600 is an image in a section of the reflected light 212 of the laser beam 21 which section is parallel with both the Y-axis direction and the Z-axis direction. Incidentally, in the present invention, the X-axis direction and the Y-axis direction are not limited to the X- and Y-directions in FIG. 3.

The XZ plane image 500 examples of which are depicted in FIG. 4, FIG. 5, and FIG. 6 and the YZ plane image 600 examples of which are depicted in FIG. 7, FIG. 8, and FIG. 9 represent an example. The image forming section 101 forms the XZ plane image 500 and the YZ plane image 600 in the sections according to an operation of the operator from the input unit 111 in a state in which the XY plane image 400 is displayed on the display unit 110, and displays the formed XZ plane image 500 and the formed YZ plane image 600 on the display unit 110. Incidentally, an axis of abscissas in FIG. 4, FIG. 5, and FIG. 6 indicates a position in the X-axis direction, an axis of abscissas in FIG. 7, FIG. 8, and FIG. 9 indicates a position in the Y-axis direction, and an axis of ordinates in FIGS. 4 to 9 indicates the intensity of the reflected light 212 of the laser beam 21.

The phase pattern generating section 102 generates a phase pattern having a plurality of Zernike coefficients of predetermined values input from the input unit 111 and displays the generated phase pattern on the display unit 241 of the spatial light modulator 24. Incidentally, the Zernike coefficients correspond to respective aberrations caused at a beam spot by the optical system of the laser beam irradiating unit 20. As the aberrations of the optical system of the laser beam irradiating unit 20, there are, for example, an "astigmatism 0°," an "astigmatism 90°," an "astigmatism +45°," an "astigmatism −45°," a "coma aberration +X," a "coma aberration −X," a "coma aberration +Y," a "coma aberration −Y," a "spherical aberration +," a "spherical aberration −," a "trefoil aberration +X," a "trefoil aberration −X," a "trefoil aberration +Y," and a "trefoil aberration −Y."

The phase pattern generating section 102 receives a predetermined value of each Zernike coefficient input from the input unit 111. When the phase pattern generating section 102 receives the values of all of the Zernike coefficients, the phase pattern generating section 102 generates a phase pattern having the Zernike coefficients of the received values. The phase pattern generating section 102 displays the generated phase pattern on the display unit 241. In addition, when the operator changes the value of one optional Zernike coefficient by operating the input unit 111, and the phase pattern generating section 102 receives the changed value of the Zernike coefficient, the phase pattern generating section 102 generates a phase pattern having the Zernike coefficient of the changed value, and displays the phase pattern on the display unit 241.

Figure 10:
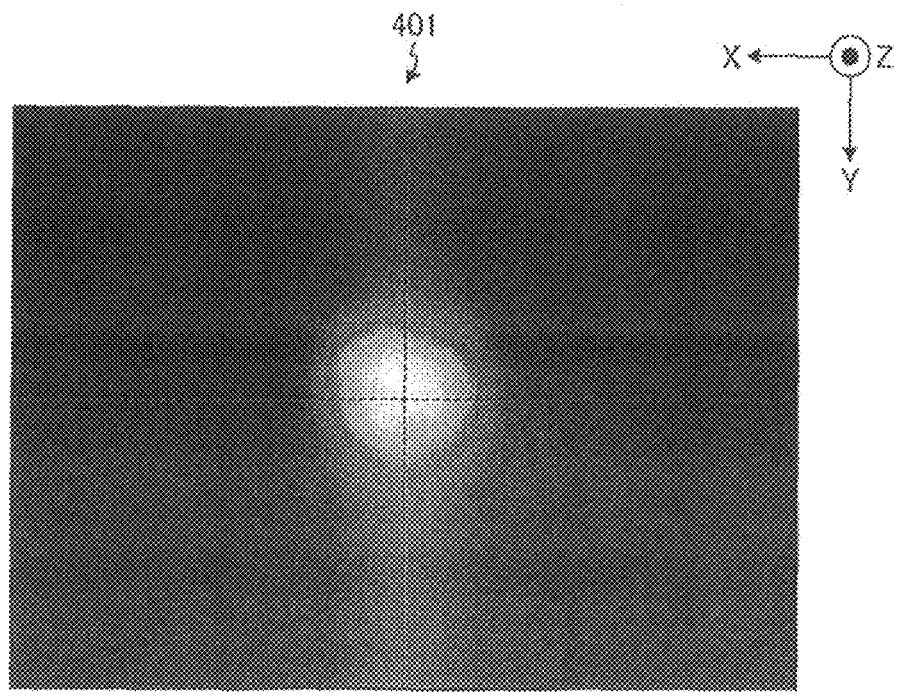
FIG. 10 is a diagram depicting an ideal XY plane image of a laser beam having an ideal shape and an ideal intensity distribution in the laser beam spot shape correcting method according to the first embodiment.

The storage section 103 stores an ideal XY plane image 401 (depicted in FIG. 10) having a shape and a spatial intensity distribution of the reflected light 212 of the laser beam 21 from which an ideal processing result is obtained at a processing point during a processing operation input from the input unit 111 or the like. FIG. 10 is a diagram depicting an ideal XY plane image of a laser beam having an ideal shape and an ideal intensity distribution in the laser beam spot shape correcting method according to the first embodiment.

Incidentally, the ideal XY plane image 401 is an XY plane image obtained by the beam profiler 28 by imaging the reflected light 212 of the laser beam 21 from which an ideal processing result is obtained at the processing point during the processing operation. Incidentally, the value of each Zernike coefficient of the reflected light 212 of the laser beam 21 from which the ideal XY plane image 401 is generated is an ideal value of each Zernike coefficient. In addition, in the present invention, all of the Zernike coefficients of the ideal XY plane image 401 are equal to or less than a predetermined value.

Incidentally, functions of the image forming section 101 and the phase pattern generating section 102 are implemented by the arithmetic processing unit by performing arithmetic processing according to a computer program stored in the storage unit. Functions of the storage section 103 are implemented by the storage unit.

When the operator registers processing content information in the control unit 100, and mounts the workpiece 200 on the holding surface 11 of the chuck table 10 via the adhesive tape 207, and the control unit 100 receives a processing operation start instruction of the operator from the input unit 111, the above-described laser processing apparatus 1 starts processing operation on the basis of the registered processing content information.

In the processing operation, the laser processing apparatus 1 sucks and holds the workpiece 200 on the holding surface 11 of the chuck table 10 via the adhesive tape 207 and clamps the annular frame 206 by the clamp units 14. Next, the moving unit 30 moves the chuck table 10 to a position below the imaging unit 40, and the imaging unit 40 photographs the workpiece 200. The laser processing apparatus 1 carries out alignment on the basis of an image obtained by the imaging of the imaging unit 40.

The laser processing apparatus 1 moves the laser beam irradiating unit 20 and the workpiece 200 relative to each other along a planned dividing line 203 by the moving unit 30 on the basis of the processing content information, and irradiates the planned dividing line 203 with the pulsed laser beam 21 from the laser beam irradiating unit 20. In the first embodiment, the laser processing apparatus 1 forms a modified layer within the substrate 201 along the planned dividing line 203 by applying the laser beam 21. When the laser processing apparatus 1 forms the modified layer within the substrate 201 along all of the planned dividing lines 203, the laser processing apparatus 1 stops applying the laser beam 21 and ends the processing operation.

Figure 11:
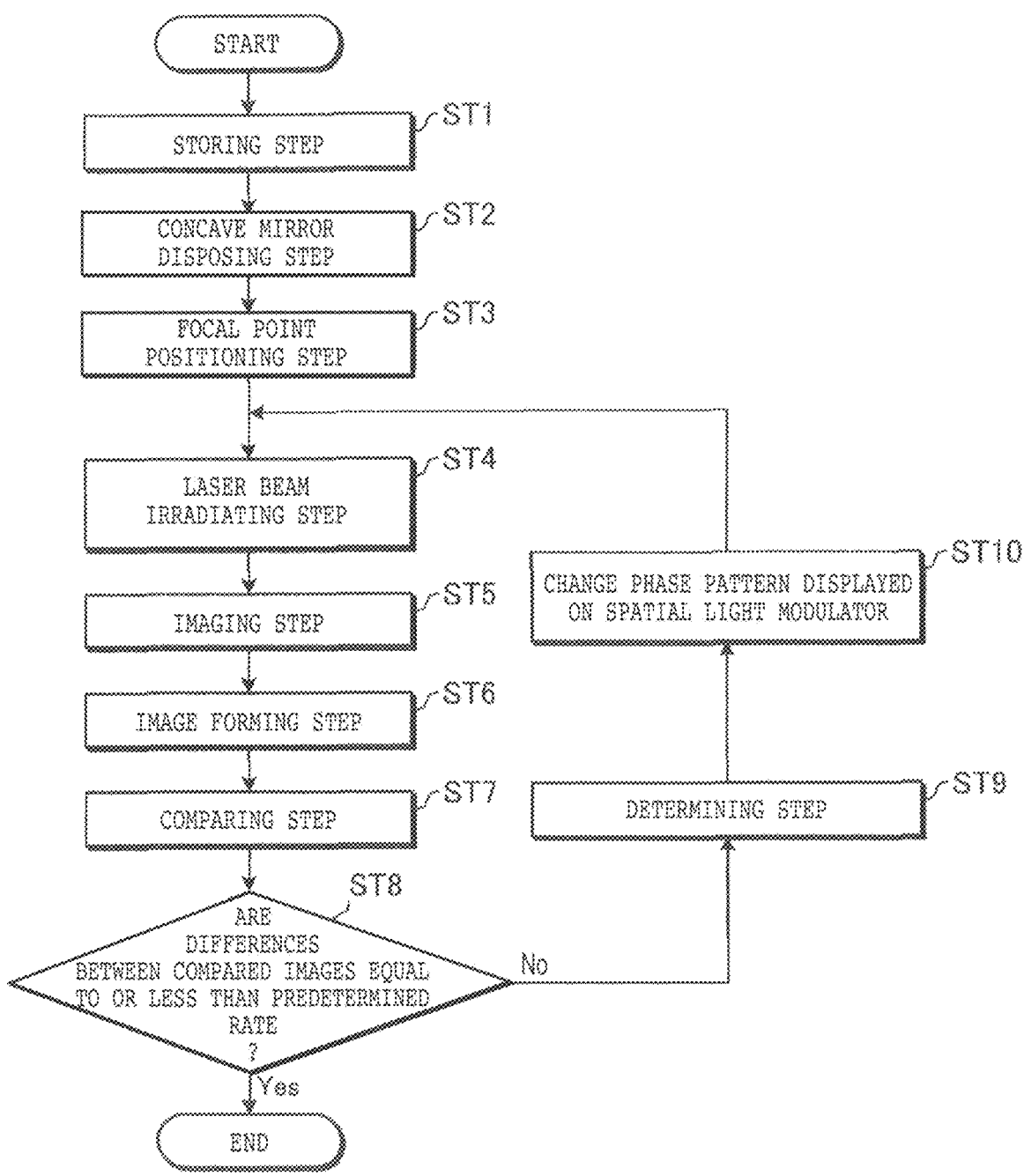
FIG. 11 is a flowchart of assistance in explaining the laser beam spot shape correcting method according to the first embodiment.
Figure 12:
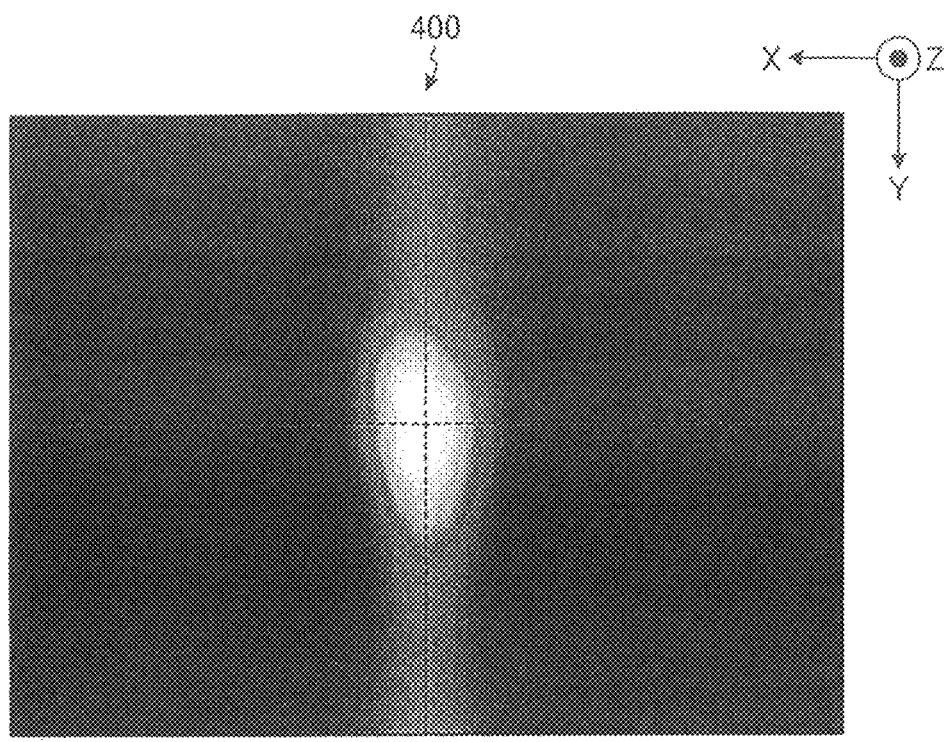
FIG. 12 is a diagram depicting an example of an XY plane image obtained by imaging the reflected light in an imaging step of the laser beam spot shape correcting method depicted in FIG. 11.
Figure 13:
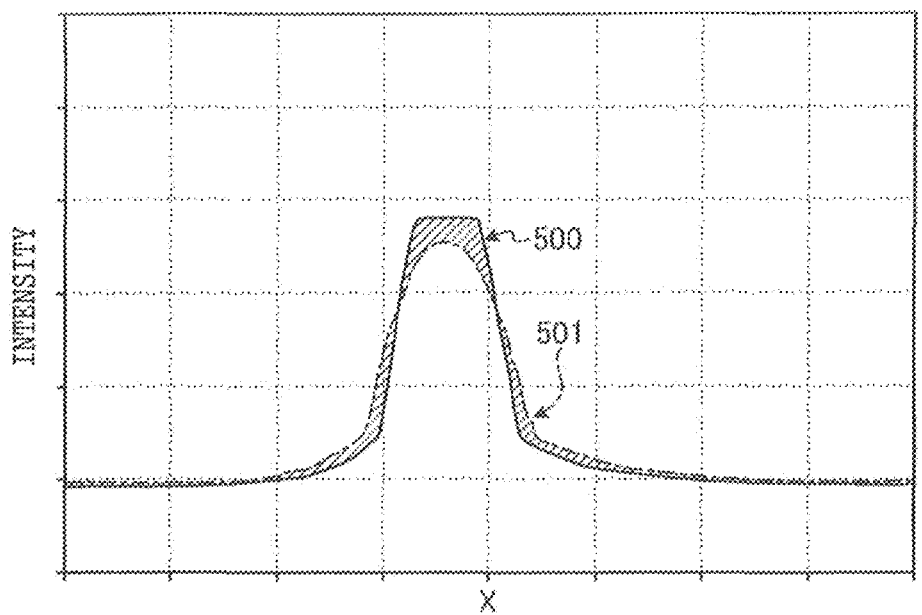
FIG. 13 is a diagram depicting an example of an XZ plane image displayed on a display unit in a comparing step of the laser beam spot shape correcting method depicted in FIG. 11.
Figure 14:
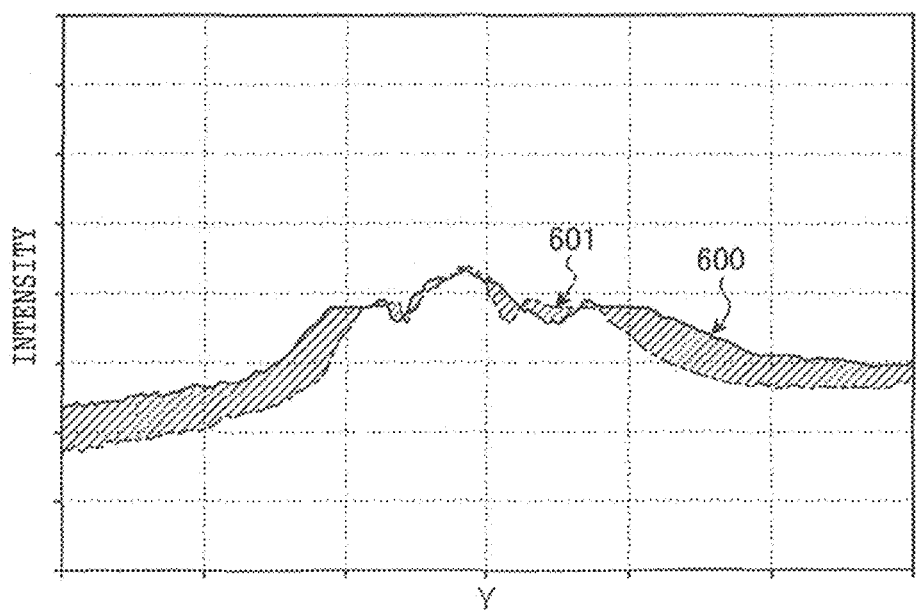
FIG. 14 is a diagram depicting an example of a YZ plane image displayed on the display unit in the comparing step of the laser beam spot shape correcting method depicted in FIG. 11.

The laser processing apparatus 1 performs the following laser beam spot shape correcting method before the start of the processing operation. The laser beam spot shape correcting method will next be described. FIG. 11 is a flowchart of assistance in explaining the laser beam spot shape correcting method according to the first embodiment. FIG. 12 is a diagram depicting an example of an XY plane image obtained by imaging the reflected light in an imaging step of the laser beam spot shape correcting method depicted in FIG. 11. FIG. 13 is a diagram depicting an example of an XZ plane image displayed on the display unit in a comparing step of the laser beam spot shape correcting method depicted in FIG. 11. FIG. 14 is a diagram depicting an example of a YZ plane image displayed on the display unit in the comparing step of the laser beam spot shape correcting method depicted in FIG. 11.

The laser beam spot shape correcting method (hereinafter written as the correcting method) according to the first embodiment brings the XY plane image 400 (depicted in FIG. 12) depicting the shape and intensity distribution of the reflected light of the laser beam close to the ideal XY plane image 401 (depicted in FIG. 10) by correcting the spot shape of the laser beam condensed by the condensing lens 23. The correcting method according to the first embodiment is a method of adjusting the phase pattern displayed on the display unit 241 of the spatial light modulator 24 to a phase pattern that enables the laser beam 21 from which an ideal processing result is obtained to be applied at the processing point in the processing operation in order to bring the XY plane image 400 of the reflected light 212 of the laser beam 21 which plane image is obtained by the imaging of the beam profiler 28 close to the ideal XY plane image 401.

As depicted in FIG. 11, the correcting method includes a storing step ST1, a concave mirror disposing step ST2, a focal point positioning step ST3, a laser beam irradiating step ST4, an imaging step ST5, an image forming step ST6, a comparing step ST7, and a determining step ST9.

The storing step ST1 is a step of storing, in the storage section 103, the ideal XY plane image 401 having the shape and spatial intensity distribution of the reflected light 212 of the laser beam 21 from which an ideal processing result is obtained at the processing point during the processing operation. In the storing step ST1 in the first embodiment, the control unit 100 receives an operation of the input unit 111 by the operator and stores the ideal XY plane image 401 in the storage section 103.

The concave mirror disposing step ST2 is a step of positioning the concave mirror 25 having the reflecting surface 252 as a spherical surface at a position facing the condensing lens 23 of the laser beam irradiating unit 20 in the Z-axis direction. In the concave mirror disposing step ST2 in the first embodiment, the control unit 100 makes the condensing lens 23 of the laser beam irradiating unit 20 and the reflecting surface 252 of the concave mirror 25 face each other along the Z-axis direction by controlling the X-axis moving unit 31 and the Y-axis moving unit 32.

The focal point positioning step ST3 is a step of positioning the condensing point 211 of the condensing lens 23 at the position of the focal point 251 of the concave mirror 25 after the concave mirror disposing step ST2. In the focal point positioning step ST3 in the first embodiment, the control unit 100 positions the condensing point 211 of the condensing lens 23 at the focal point 251 of the reflecting surface 252 by controlling the Z-axis moving unit 33.

The laser beam irradiating step ST4 is a step of emitting the laser beam 21 from the laser oscillator 22 by actuating the laser oscillator 22, and irradiating the reflecting surface 252 of the concave mirror 25 with the laser beam 21 condensed by the condensing lens 23. In the laser beam irradiating step ST4, the control unit 100 receives an operation of the input unit 111 by the operator and stores each Zernike coefficient of a predetermined value. Incidentally, in the first embodiment, the predetermined value is an optional value. In the laser beam irradiating step ST4, when the phase pattern generating section 102 receives the values of all of the Zernike coefficients, the phase pattern generating section 102 generates a phase pattern having the Zernike coefficients of the received values. In the laser beam irradiating step ST4, the phase pattern generating section 102 displays the generated phase pattern on the display unit 241.

In the laser beam irradiating step ST4 in the first embodiment, after the phase pattern generating section 102 displays the generated phase pattern on the display unit 241, the control unit 100 oscillates a laser by actuating the laser oscillator 22. In the laser beam irradiating step ST4, the reflecting surface 252 of the concave mirror 25 is irradiated with the laser beam 21 emitted from the laser oscillator 22 via the spatial light modulator 24, the beam splitter 26, the condensing lens 23, and the like. The optical characteristic of the laser beam 21 applied to the reflecting surface 252 is a characteristic corresponding to the phase pattern generated by the phase pattern generating section 102 and displayed on the display unit 241.

The imaging step ST5 is a step of imaging the reflected light 212 of the laser beam 21 reflected by the reflecting surface 252 of the concave mirror 25 by the beam profiler 28. In the imaging step ST5 in the first embodiment, the reflected light 212 of the laser beam 21 reflected by the reflecting surface 252 is reflected to the attenuating means 27 by the beam splitter 26, and is imaged by the beam profiler 28. In the imaging step ST5 in the first embodiment, the beam profiler 28 images the reflected light 212 of the laser beam 21, thereby obtains the XY plane image 400 (depicted in FIG. 12) of the reflected light 212 of the laser beam 21, the XY plane image 400 having the shape and spatial intensity distribution of the reflected light 212 of the laser beam 21, and outputs the obtained XY plane image 400 to the control unit 100.

The image forming step ST6 is a step of forming the XZ plane image 500 (depicted in FIG. 13) or the YZ plane image 600 (depicted in FIG. 14) from the XY plane image 400 of the reflected light 212 of the laser beam 21, the XY plane image 400 being obtained by the imaging in the imaging step ST5 and depicting the shape and spatial intensity distribution of the reflected light 212 of the laser beam 21.

In the image forming step ST6 in the first embodiment, the image forming section 101 of the control unit 100 outputs, to the display unit 110, the XY plane image 400 of the reflected light 212 of the laser beam 21, the XY plane image 400 being obtained by the imaging in the imaging step ST5 and having the shape and spatial intensity distribution of the reflected light 212 of the laser beam 21, to display the XY plane image 400 on the display unit 110. In the image forming step ST6 in the first embodiment, the image forming section 101 receives an operation of the operator from the input unit 111 in a state in which the XY plane image 400 is displayed on the display unit 110, and forms the XZ plane image 500 and the YZ plane image 600 in section according to the operation of the operator from the XY plane image 400.

The comparing step ST7 is a step of comparing the XZ plane image 500 (an example of which is represented by a solid line in FIG. 13) or the YZ plane image 600 (an example of which is represented by a solid line in FIG. 14) as an image formed in the image forming step ST6 with an XZ plane image 501 (an example of which is represented by alternate long and short dashed lines in FIG. 13) or a YZ plane image 601 (an example of which is represented by alternate long and short dashed lines in FIG. 14) of the ideal XY plane image 401. Incidentally, an axis of abscissas in FIG. 13 indicates a position in the X-axis direction, an axis of abscissas in FIG. 14 indicates a position in the Y-axis direction, and an axis of ordinates in FIG. 13 and FIG. 14 indicates the intensity of the reflected light 212 of the laser beam 21. In addition, the XZ plane image 501 is an XZ plane image of the reflected light 212 of the laser beam 21 having an ideal shape and an ideal intensity distribution, and the YZ plane image 601 is a YZ plane image of the reflected light 212 of the laser beam 21 having an ideal shape and an ideal intensity distribution.

In the comparing step ST7 in the first embodiment, the image forming section 101 forms the XZ plane image 501 and the YZ plane image 601 in section according to the operation of the operator from the ideal XY plane image 401. As depicted in FIG. 13, the control unit 100 displays, on the display unit 110, the XZ plane image 500 formed in the image forming step ST6 in a state of being superimposed on the XZ plane image 501 formed from the ideal XY plane image 401. In addition, as depicted in FIG. 14, the control unit 100 displays, on the display unit 110, the YZ plane image 600 formed in the image forming step ST6 in a state of being superimposed on the YZ plane image 601 formed from the ideal XY plane image 401.

Incidentally, while the XZ plane images 500 and 501 are displayed in a state of being superimposed on each other on the display unit 110 and the YZ plane images 600 and 601 are displayed in a state of being superimposed on each other on the display unit 110, it suffices in the present invention to perform at least one of the displaying of the XZ plane images 500 and 501 in a state of being superimposed on each other on the display unit 110 and the displaying of the YZ plane images 600 and 601 in a state of being superimposed on each other on the display unit 110.

Thereafter, the operator determines whether or not at least one of differences between the XZ plane images 500 and 501 and between the YZ plane images 600 and 601 as images displayed in a state of being superimposed on each other on the display unit 110 and compared with each other in the comparing step ST7 is equal to or less than a predetermined rate (step ST8). When the operator determines that at least one of the differences between the XZ plane images 500 and 501 and between the YZ plane images 600 and 601 is larger than the predetermined rate (step ST8: No), the processing proceeds to a determining step ST9.

The determining step ST9 is a step of determining which aberration component is included in the XY plane image 400 obtained by the imaging in the imaging step ST5 and having the shape and spatial intensity distribution of the reflected light 212 of the laser beam 21. In the determining step ST9 in the first embodiment, an operation of the input unit 111 by the operator is received, and the control unit 100 displays the XY plane image 400 on at least the display unit 110. Incidentally, in addition to the XY plane image 400, the display unit 110 may display the ideal XY plane image 401 and may display the XZ plane images 500 and 501 and the YZ plane images 600 and 601.

In the determining step ST9, the operator determines an aberration as a largest difference of the XY plane image 400 from the ideal XY plane image 401 on the basis of at least one of the difference between the XY plane images 400 and 401, the difference between the XZ plane images 500 and 501, and the difference between the YZ plane images 600 and 601. Thus, in the determining step ST9, which aberration component is included in the XY plane image 400 is determined by determining the aberration as the largest difference of the XY plane image 400 from the ideal XY plane image 401.

Thereafter, the operator changes the value of a Zernike coefficient corresponding to the aberration determined in the determining step ST9 by a predetermined value by operating the input unit 111, and thereby brings the value of the Zernike coefficient close to an ideal value. When the phase pattern generating section 102 of the control unit 100 receives the changed value of the Zernike coefficient, the phase pattern generating section 102 generates a phase pattern having the Zernike coefficient of the changed value, and displays the phase pattern on the display unit 241 (step ST10). The processing then returns to the laser beam irradiating step ST4. The aberration component of the laser beam 21 imaged in the imaging step ST5 is brought close to the aberration component of the laser beam 21 from which an ideal processing result is obtained by thus displaying a phase pattern such as cancels out the aberration determined in the determining step ST9 on the display unit 241 of the spatial light modulator 24.

When the operator determines that both of the differences between the XZ plane images 500 and 501 and between the YZ plane images 600 and 601 are equal to or less than the predetermined rate (step ST8: Yes), the correcting method is ended. Thus, in the step ST8, when both of the differences between the XZ plane images 500 and 501 and between the YZ plane images 600 and 601 are equal to or less than the predetermined rate as a result of the comparing step ST7, it is determined that the phase pattern displayed on the display unit 241, that is, the laser beam 21 applied to the workpiece 200 is acceptable. When at least one of the differences between the XZ plane images 500 and 501 and between the YZ plane images 600 and 601 is larger than the predetermined rate, the processing returns to the laser beam irradiating step ST4 via the determining step ST9 and the step ST10 to correct the phase pattern, that is, correct the XY plane image 400 as the spot shape of the laser beam 21 again.

In addition, in the correcting method according to the first embodiment, when the value of one Zernike coefficient is changed by a predetermined value and thus adjusted so as to be brought close to an ideal value in the step ST10, variations occur also in aberrations corresponding to the other Zernike coefficients than the Zernike coefficient whose value is changed among the aberrations included in the XY plane image 400 obtained by the beam profiler 28 in the imaging step ST5. Accordingly, the correcting method according to the first embodiment repeats the laser beam irradiating step ST4, the imaging step ST5, the comparing step ST7, the step ST8, the determining step ST9, and the step ST10, and changes the values of the Zernike coefficients one by one until it is determined in the step ST8 that both of the differences between the XZ plane images 500 and 501 and between the YZ plane images 600 and 601 are equal to or less than the predetermined rate.

Therefore, the correcting method according to the first embodiment changes the phase pattern displayed on the display unit 241 of the spatial light modulator 24 such that the XZ plane image 500 or the YZ plane image 600 formed in the image forming step ST6 coincides with the XZ plane image 501 or the YZ plane image 601 formed from the ideal XY plane image 401 having the shape and spatial intensity distribution of the reflected light 212 of the laser beam 21 from which an ideal processing result is obtained, by repeating the laser beam irradiating step ST4, the imaging step ST5, the comparing step ST7, the step ST8, the determining step ST9, and the step ST10 until it is determined in the step ST8 that both of the differences between the XZ plane images 500 and 501 and between the YZ plane images 600 and 601 are equal to or less than the predetermined rate.

As described above, in the comparing step ST7, the correcting method according to the first embodiment performs at least one of the displaying of the XZ plane images 500 and 501 in a state of being superimposed on each other on the display unit 110 and the displaying of the YZ plane images 600 and 601 in a state of being superimposed on each other on the display unit 110. It is therefore possible to determine easily in the step ST8 whether or not at least one of the differences between the XZ plane images 500 and 501 and between the YZ plane images 600 and 601 is equal to or less than the predetermined rate.

In addition, when the correcting method according to the first embodiment determines in the step ST8 that at least one of the differences between the XZ plane images 500 and 501 and between the YZ plane images 600 and 601 is larger than the predetermined rate, the correcting method according to the first embodiment displays the XY plane image 400 on at least the display unit 110 in the determining step ST9, and the operator determines an aberration as a largest difference of the XY plane image 400 from the ideal XY plane image 401. Therefore, the correcting method according to the first embodiment can suppress the number of man-hours taken to correct the aberration of the laser beam 21 to the aberration of the laser beam 21 from which an ideal processing result is obtained at the processing point. As a result, the correcting method according to the first embodiment can suppress the number of man-hours necessary to correct the spot shape of the laser beam 21.

In addition, the correcting method according to the first embodiment in the step ST8 displays at least either the XZ plane images 500 and 501 or the YZ plane images 600 and 601 on the display unit 110, so that it is possible to determine easily whether or not at least one of the differences between the XZ plane images 500 and 501 and between the YZ plane images 600 and 601 is equal to or less than the predetermined rate. The correcting method according to the first embodiment displays the XY plane image 400 on at least the display unit 110 in the determining step ST9, and the operator determines an aberration as a largest difference of the XY plane image 400 from the ideal XY plane image 401. In addition, the correcting method according to the first embodiment repeats the laser beam irradiating step ST4, the imaging step ST5, the comparing step ST7, the step ST8, the determining step ST9, and the step ST10 until it is determined in the step ST8 that both of the differences between the XZ plane images 500 and 501 and between the YZ plane images 600 and 601 are equal to or less than the predetermined rate. Therefore, the correcting method according to the first embodiment can bring the aberration of the laser beam 21 close to the aberration of the laser beam 21 from which an ideal processing result is obtained at the processing point. As a result, the correcting method according to the first embodiment can suppress a machine difference between processing apparatuses in terms of the spot shape of the laser beam 21.

Hence, the correcting method according to the first embodiment produces effects of being able to suppress the number of man-hours necessary to correct the spot shape of the laser beam 21 and being able to reduce a machine difference between processing apparatuses in terms of the laser beam 21 applied to the workpiece 200.

Second Embodiment

Figure 15:
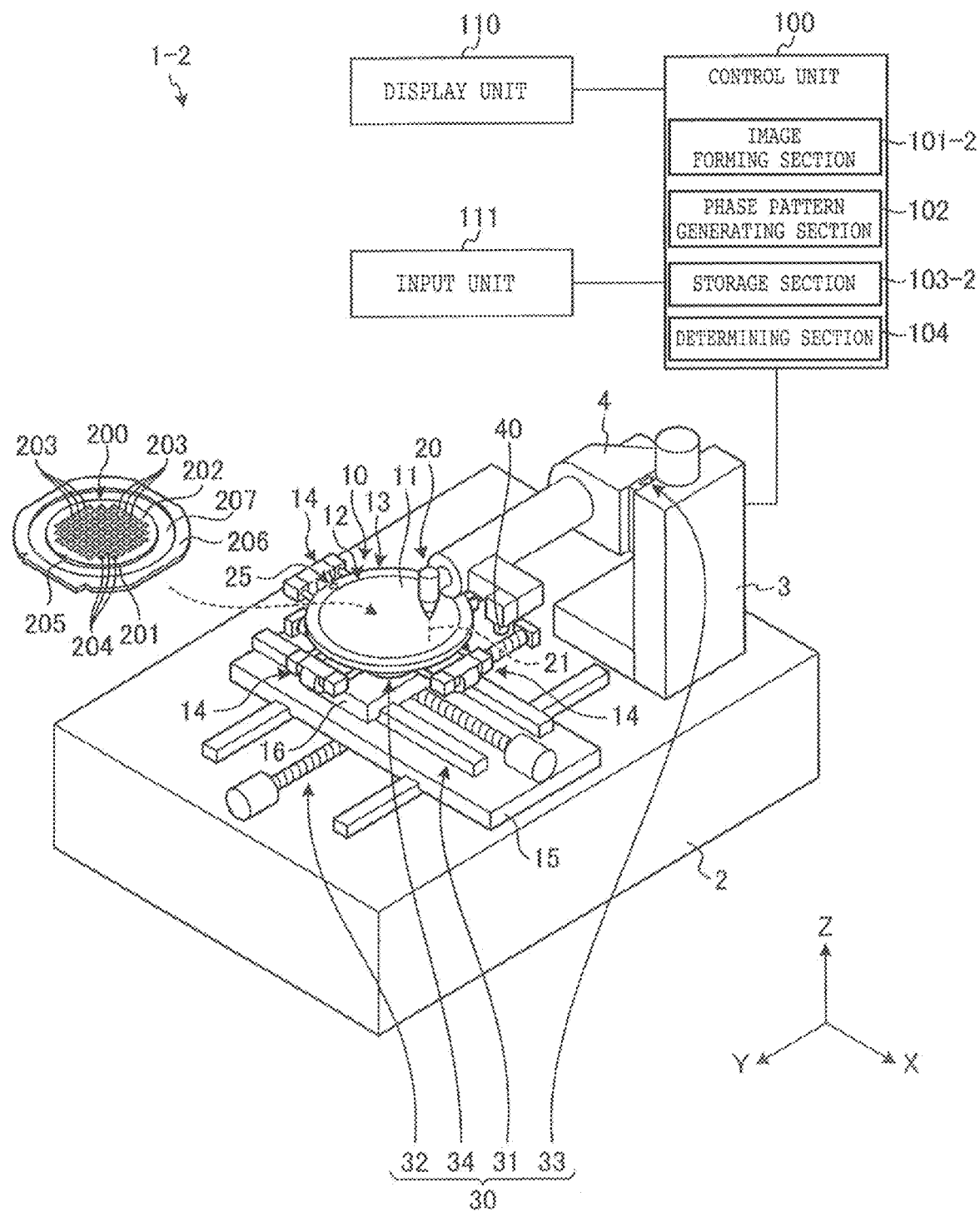
FIG. 15 is a perspective view depicting an example of a configuration of a laser processing apparatus that performs a laser beam spot shape correcting method according to a second embodiment.
Figure 16:
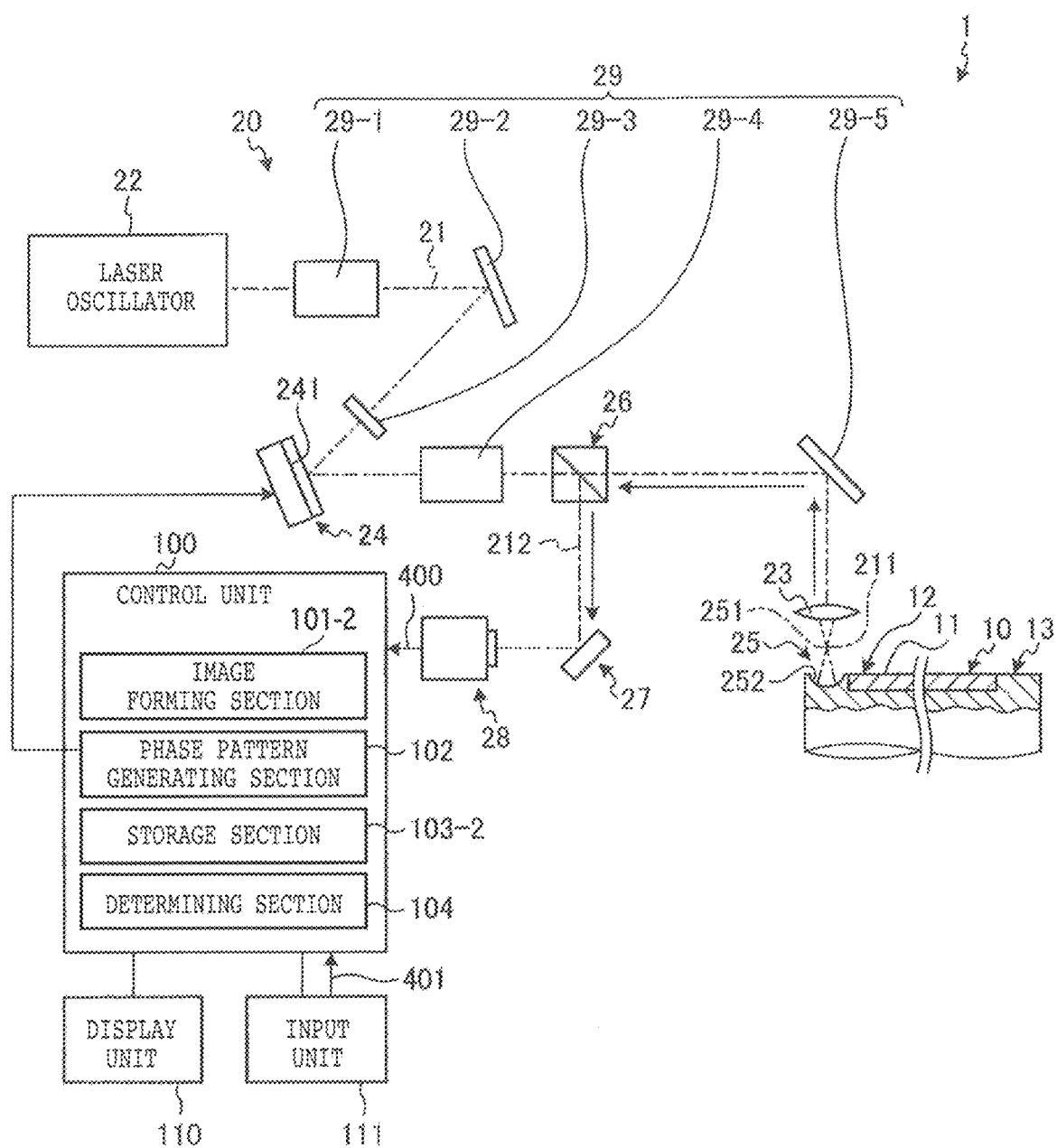
FIG. 16 is a schematic diagram depicting a configuration of a laser beam irradiating unit of the laser processing apparatus depicted in FIG. 15.

A laser beam spot shape correcting method according to a second embodiment of the present invention will be described with reference to the drawings. FIG. 15 is a perspective view depicting an example of a configuration of a laser processing apparatus that performs the laser beam spot shape correcting method according to the second embodiment. FIG. 16 is a diagram of assistance in explaining a configuration of a laser beam irradiating unit of the laser processing apparatus depicted in FIG. 15. Incidentally, in FIG. 15 and FIG. 16, the same parts as in the first embodiment are identified by the same reference numerals, and description thereof will be omitted.

A laser processing apparatus 1-2 that performs the laser beam spot shape correcting method (hereinafter written as the correcting method) according to the second embodiment is the same as in the first embodiment except that functions of an image forming section 101-2 and a storage section 103-2 are added and the control unit 100 includes a determining section 104.

The storage section 103-2 of the control unit 100 of the laser processing apparatus 1-2 that performs the correcting method according to the second embodiment stores an ideal value of each Zernike coefficient of the reflected light 212 of the laser beam 21 from which an ideal processing result is obtained in the storing step ST1 in addition to the functions in the first embodiment. In addition, in the storing step ST1, the phase pattern generating section 102 of the control unit 100 of the laser processing apparatus 1-2 that performs the correcting method according to the second embodiment generates phase patterns including predetermined aberration components, generates aberration-including XY plane images 701, 702, 703, 704, 705, 706, 707, 708, 709, 710, 711, 712, 713, and 714 depicted in FIGS. 17 to 30, and stores the aberration-including XY plane images 701, 702, 703, 704, 705, 706, 707, 708, 709, 710, 711, 712, 713, and 714 in the storage section 103-2, in addition to the functions in the first embodiment.

These aberration-including XY plane images 701, 702, 703, 704, 705, 706, 707, 708, 709, 710, 711, 712, 713, and 714 are XY plane images of the reflected light 212 including aberrations which plane images are generated by imaging, by the beam profiler 28, the laser beam 21 in which Zernike coefficients corresponding to the respective aberrations are equal to or more than a predetermined value.

Thus, in the storing step ST1, the storage section 103-2 of the control unit 100 of the laser processing apparatus 1-2 that performs the correcting method according to the second embodiment stores the aberration-including XY plane images 701, 702, 703, 704, 705, 706, 707, 708, 709, 710, 711, 712, 713, and 714, and thereby stores which aberration component is included in the XY plane image 400 obtained in the imaging step ST5 with respect to the ideal XY plane image 401 having the shape and spatial intensity distribution of the reflected light 212 of the laser beam 21 from which an ideal processing result is obtained at the processing point in the processing operation.

Figure 17:
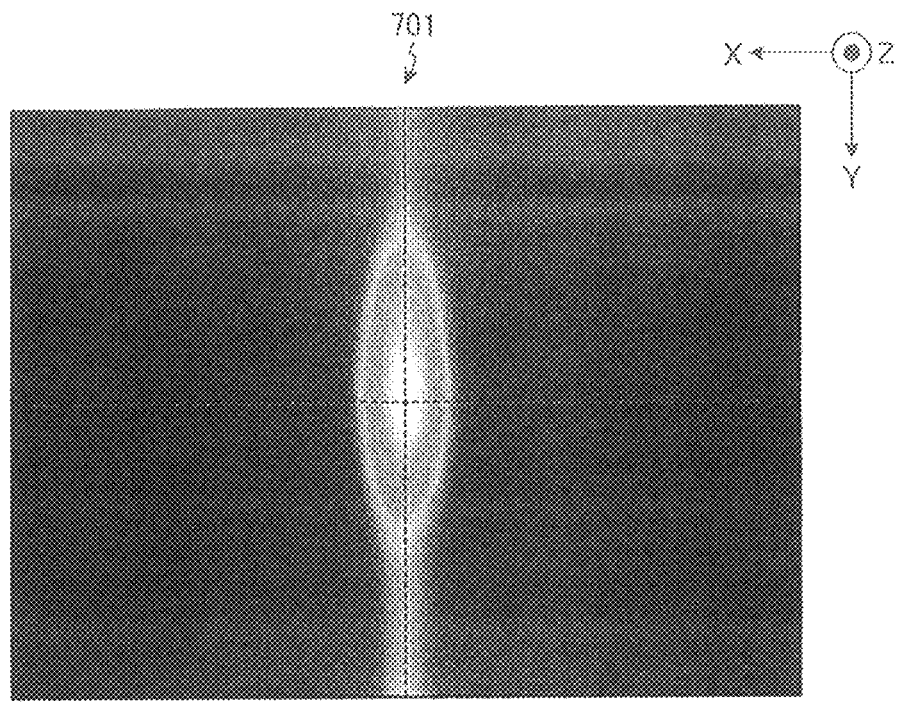
FIG. 17 is a diagram depicting an XY plane image of reflected light in which a Zernike coefficient corresponding to an astigmatism 0° is equal to or more than a predetermined value.
Figure 18:
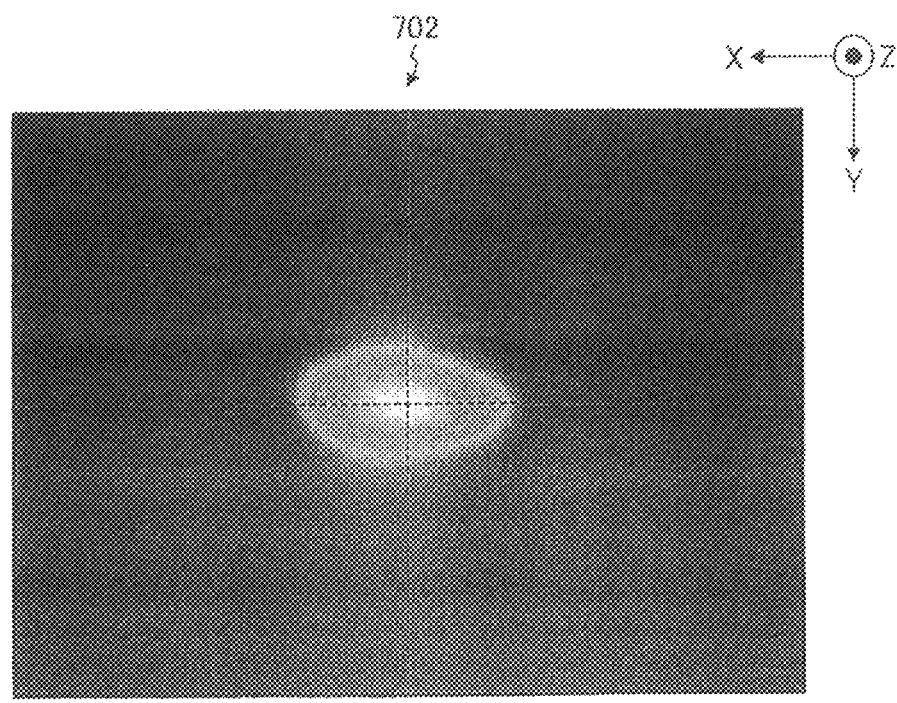
FIG. 18 is a diagram depicting an XY plane image of reflected light in which a Zernike coefficient corresponding to an astigmatism 90° is equal to or more than a predetermined value.

FIG. 17 is a diagram depicting an XY plane image of the reflected light in which the Zernike coefficient corresponding to the astigmatism 0° is equal to or more than the predetermined value. FIG. 18 is a diagram depicting an XY plane image of the reflected light in which the Zernike coefficient corresponding to the astigmatism 90° is equal to or more than the predetermined value.

Figure 19:
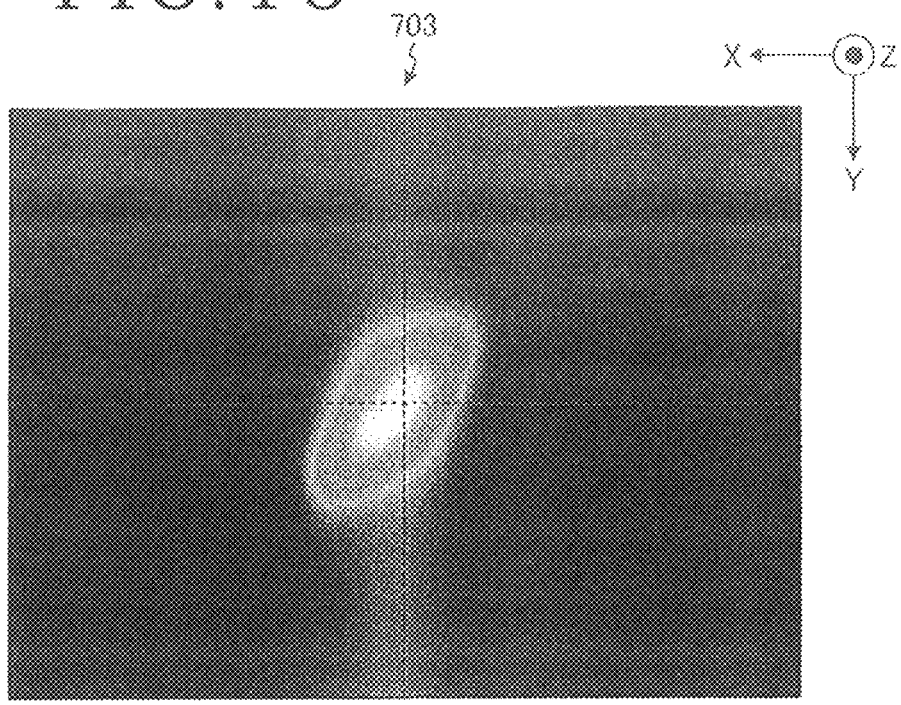
FIG. 19 is a diagram depicting an XY plane image of reflected light in which a Zernike coefficient corresponding to an astigmatism +45° is equal to or more than a predetermined value.
Figure 20:
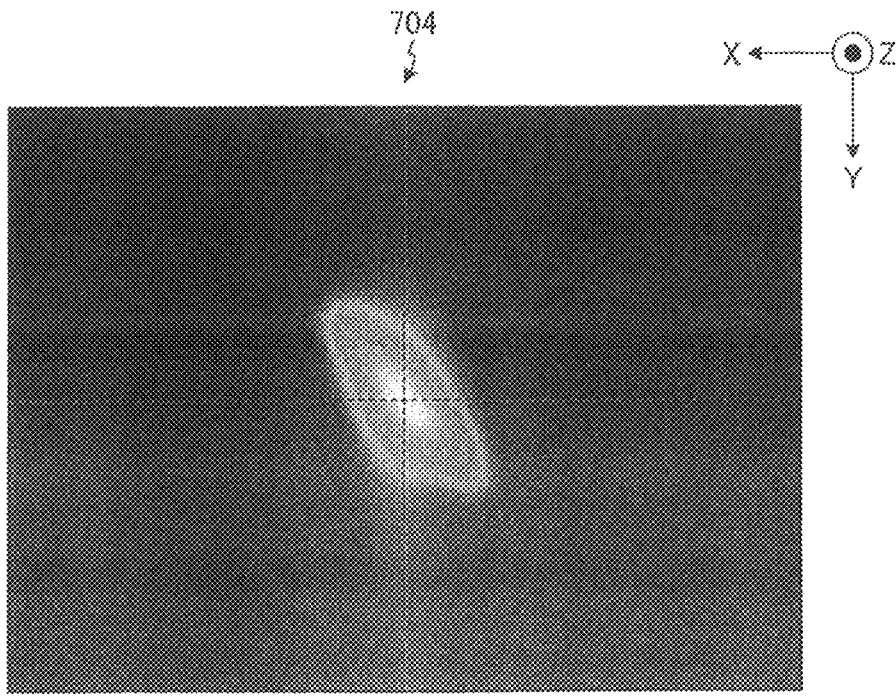
FIG. 20 is a diagram depicting an XY plane image of reflected light in which a Zernike coefficient corresponding to an astigmatism −45° is equal to or more than a predetermined value.

FIG. 19 is a diagram depicting an XY plane image of the reflected light in which the Zernike coefficient corresponding to the astigmatism +45° is equal to or more than the predetermined value. FIG. 20 is a diagram depicting an XY plane image of the reflected light in which the Zernike coefficient corresponding to the astigmatism −45° is equal to or more than the predetermined value.

Figure 21:
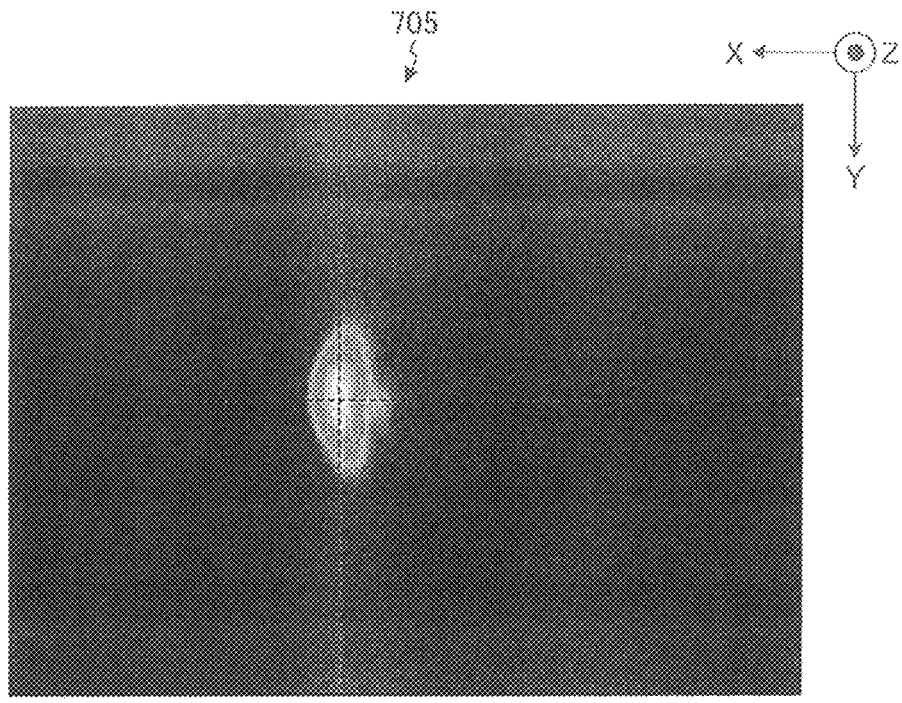
FIG. 21 is a diagram depicting an XY plane image of reflected light in which a Zernike coefficient corresponding to a coma aberration +X is equal to or more than a predetermined value.
Figure 22:
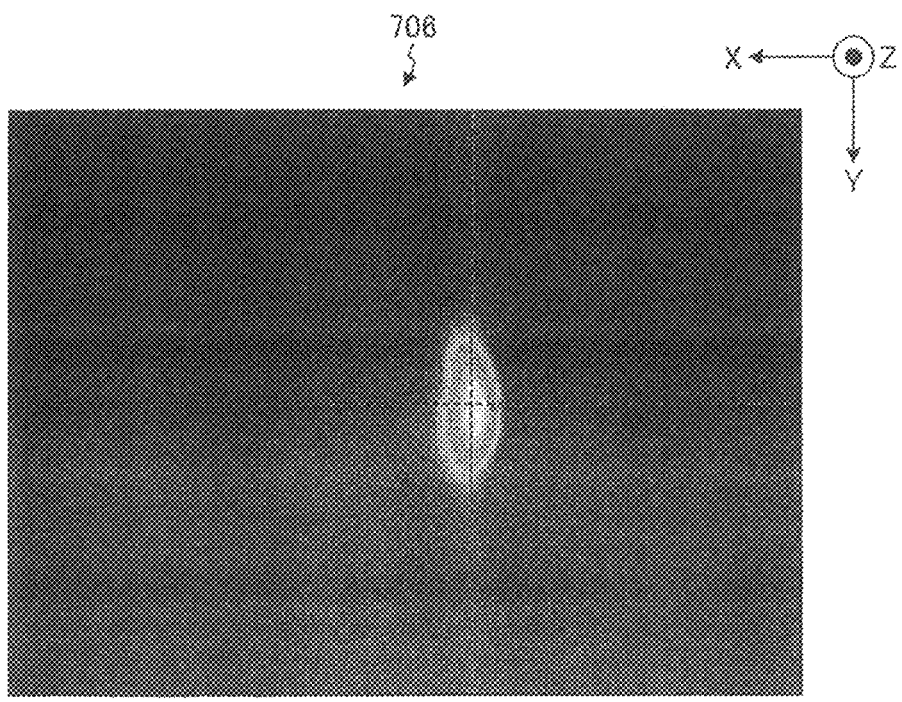
FIG. 22 is a diagram depicting an XY plane image of reflected light in which a Zernike coefficient corresponding to a coma aberration −X is equal to or more than a predetermined value.

FIG. 21 is a diagram depicting an XY plane image of the reflected light in which the Zernike coefficient corresponding to the coma aberration +X is equal to or more than the predetermined value. FIG. 22 is a diagram depicting an XY plane image of the reflected light in which the Zernike coefficient corresponding to the coma aberration −X is equal to or more than the predetermined value.

Figure 23:
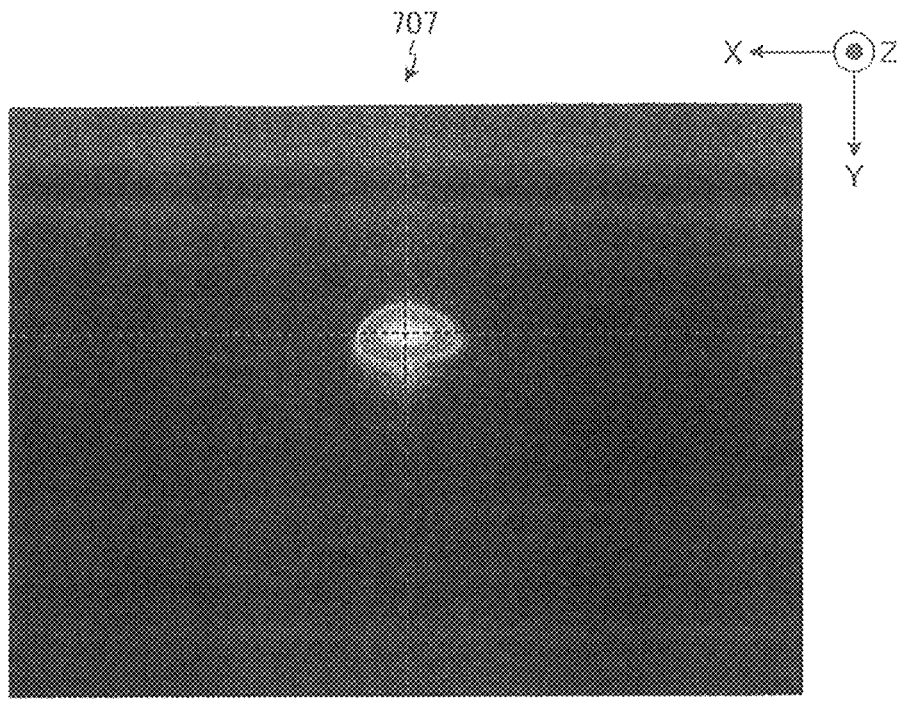
FIG. 23 is a diagram depicting an XY plane image of reflected light in which a Zernike coefficient corresponding to a coma aberration +Y is equal to or more than a predetermined value.
Figure 24:
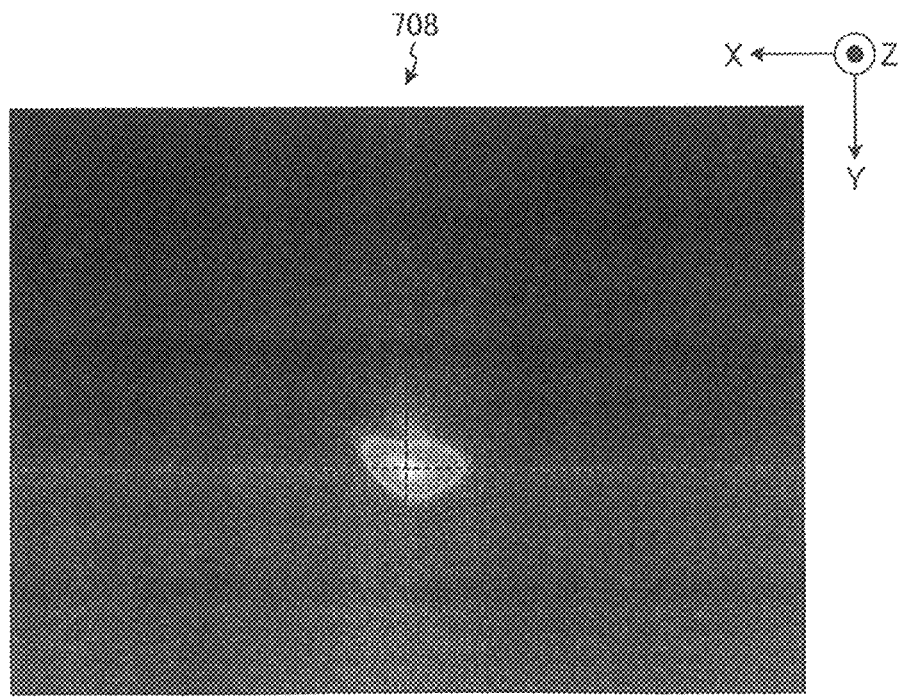
FIG. 24 is a diagram depicting an XY plane image of reflected light in which a Zernike coefficient corresponding to a coma aberration −Y is equal to or more than a predetermined value.

FIG. 23 is a diagram depicting an XY plane image of the reflected light in which the Zernike coefficient corresponding to the coma aberration +Y is equal to or more than the predetermined value. FIG. 24 is a diagram depicting an XY plane image of the reflected light in which the Zernike coefficient corresponding to the coma aberration −Y is equal to or more than the predetermined value.

Figure 25:
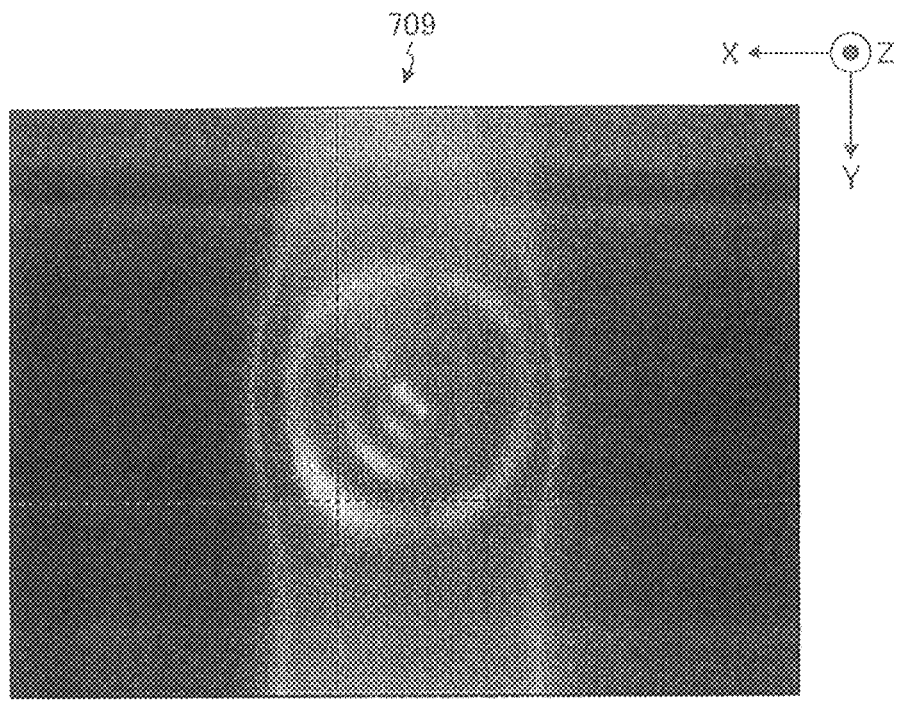
FIG. 25 is a diagram depicting an XY plane image of reflected light in which a Zernike coefficient corresponding to a spherical aberration + is equal to or more than a predetermined value.
Figure 26:
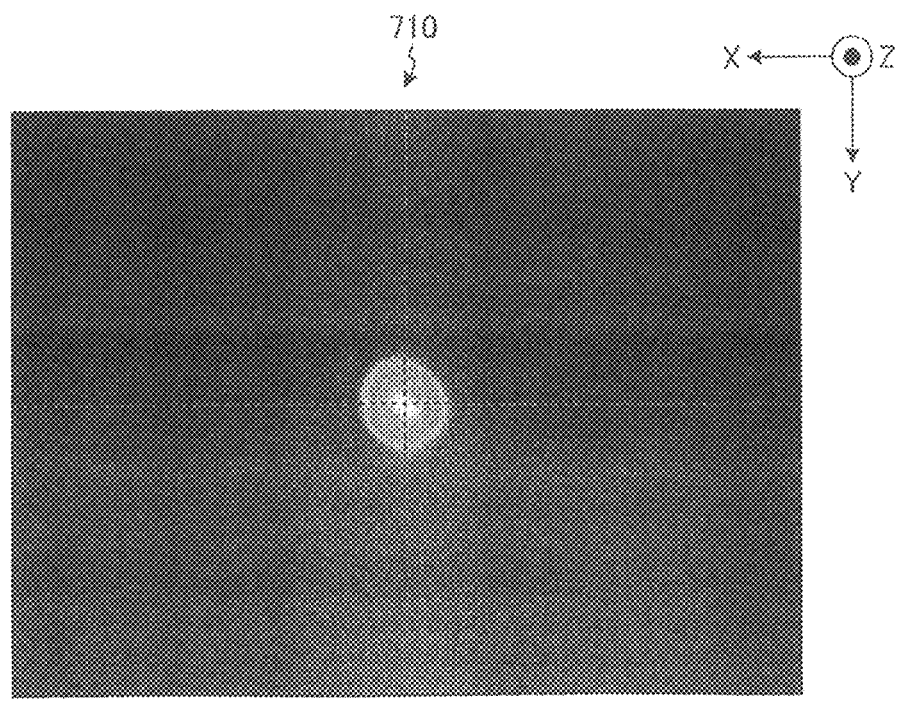
FIG. 26 is a diagram depicting an XY plane image of reflected light in which a Zernike coefficient corresponding to a spherical aberration − is equal to or more than a predetermined value.

FIG. 25 is a diagram depicting an XY plane image of the reflected light in which the Zernike coefficient corresponding to the spherical aberration + is equal to or more than the predetermined value. FIG. 26 is a diagram depicting an XY plane image of the reflected light in which the Zernike coefficient corresponding to the spherical aberration − is equal to or more than the predetermined value.

Figure 27:
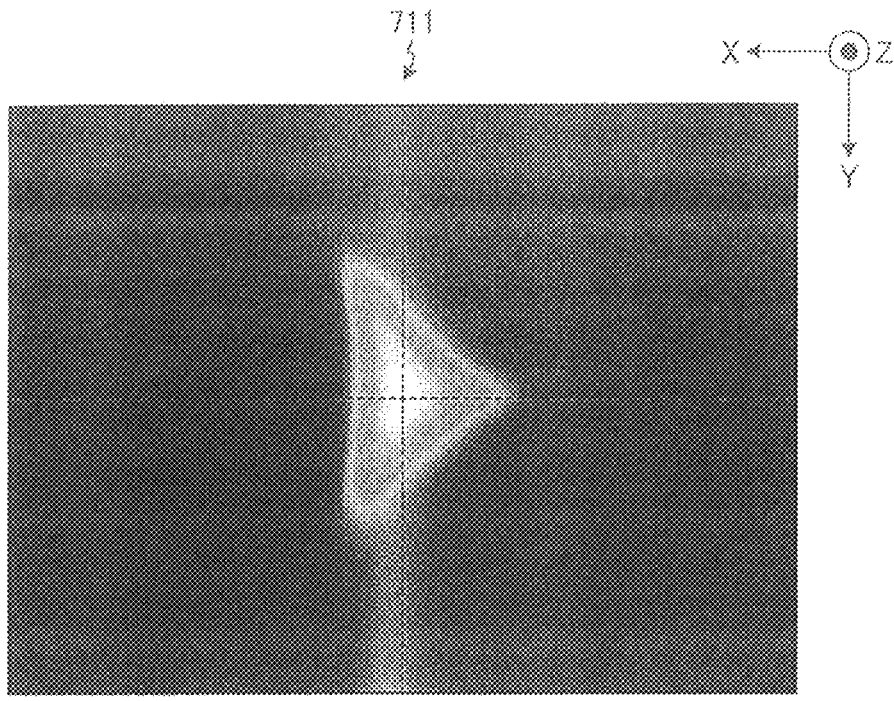
FIG. 27 is a diagram depicting an XY plane image of reflected light in which a Zernike coefficient corresponding to a trefoil aberration +X is equal to or more than a predetermined value.
Figure 28:
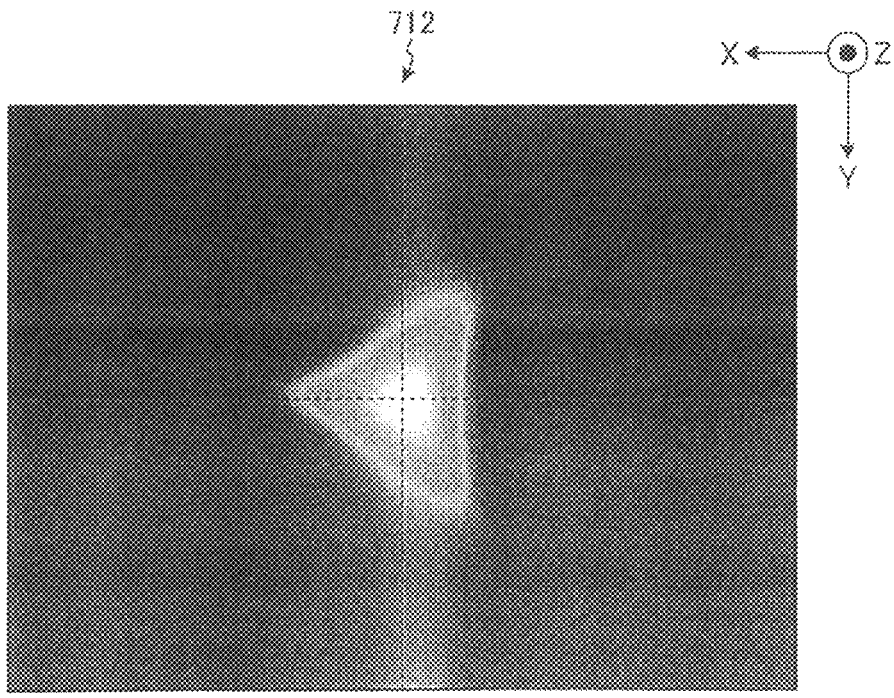
FIG. 28 is a diagram depicting an XY plane image of reflected light in which a Zernike coefficient corresponding to a trefoil aberration −X is equal to or more than a predetermined value.

FIG. 27 is a diagram depicting an XY plane image of the reflected light in which the Zernike coefficient corresponding to the trefoil aberration +X is equal to or more than the predetermined value. FIG. 28 is a diagram depicting an XY plane image of the reflected light in which the Zernike coefficient corresponding to the trefoil aberration −X is equal to or more than the predetermined value.

Figure 29:
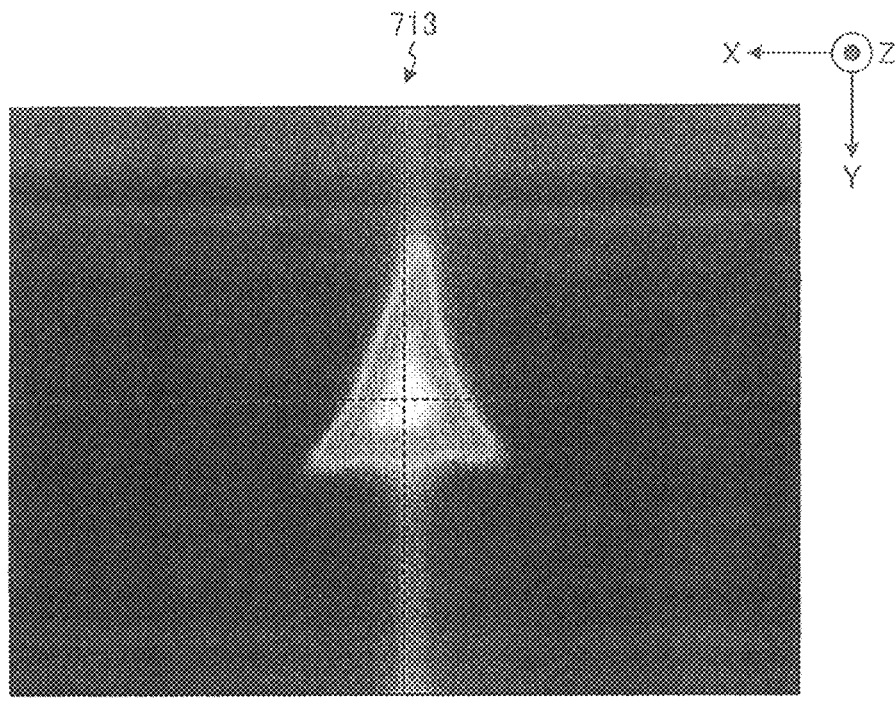
FIG. 29 is a diagram depicting an XY plane image of reflected light in which a Zernike coefficient corresponding to a trefoil aberration +Y is equal to or more than a predetermined value.
Figure 30:
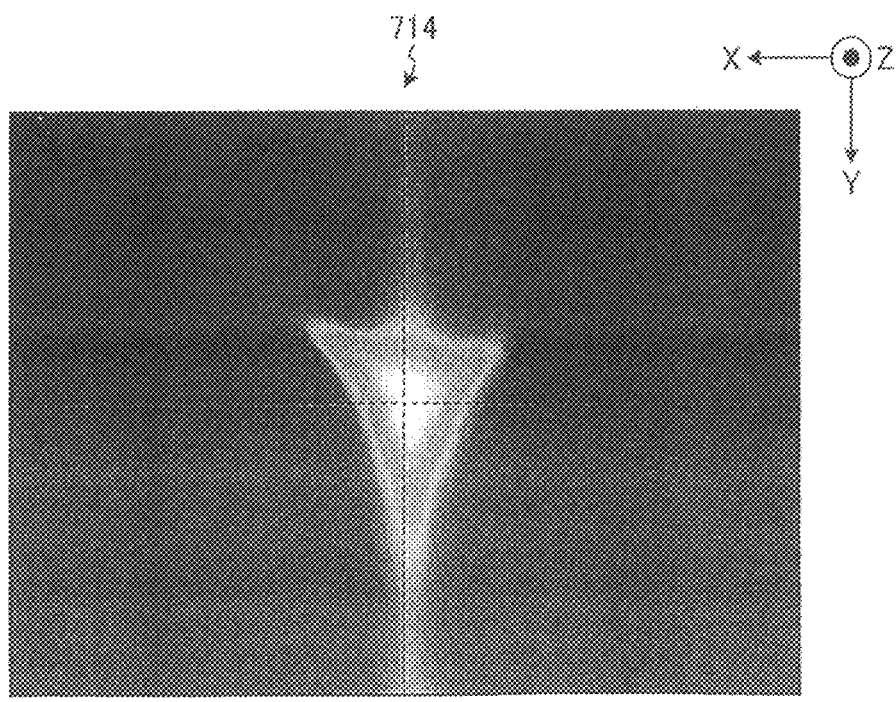
FIG. 30 is a diagram depicting an XY plane image of reflected light in which a Zernike coefficient corresponding to a trefoil aberration −Y is equal to or more than a predetermined value.

FIG. 29 is a diagram depicting an XY plane image of the reflected light in which the Zernike coefficient corresponding to the trefoil aberration +Y is equal to or more than the predetermined value. FIG. 30 is a diagram depicting an XY plane image of the reflected light in which the Zernike coefficient corresponding to the trefoil aberration −Y is equal to or more than the predetermined value.

In the comparing step ST7, the determining section 104 of the control unit 100 of the laser processing apparatus 1-2 that performs the correcting method according to the second embodiment calculates a sum total of differences between the XZ plane image 500 as an image formed in the image forming step ST6 and the XZ plane image 501 of the ideal XY plane image 401 (a part of the differences are represented by hatching in FIG. 13) and a sum total of differences between the YZ plane image 600 as an image formed in the image forming step ST6 and the YZ plane image 601 of the ideal XY plane image 401 (a part of the differences are represented by hatching in FIG. 14). Next, the determining section 104 of the control unit 100 of the laser processing apparatus 1-2 in the comparing step ST7 calculates a sum of the sum total of the differences between the XZ plane image 500 and the XZ plane image 501 of the ideal XY plane image 401 and the sum total of the differences between the YZ plane image 600 and the YZ plane image 601 of the ideal XY plane image 401. Thus, in the comparing step ST7 of the correcting method according to the second embodiment, the determining section 104 calculates the above-described sum, and thereby compares the XZ plane image 500 and the YZ plane image 600 with the XZ plane image 501 and the YZ plane image 601.

The determining section 104 of the control unit 100 of the laser processing apparatus 1-2 in the step ST8 determines whether or not the sum calculated in the comparing step ST7 is equal to or less than a predetermined value determined in advance, and thereby determines whether or not the differences between the XZ plane images 500 and 501 and between the YZ plane images 600 and 601 are equal to or less than a predetermined rate. When the determining section 104 of the control unit 100 of the laser processing apparatus 1-2 determines in the step ST8 that the sum calculated in the comparing step ST7 is larger than the predetermined value determined in advance, the determining section 104 determines that the differences between the XZ plane images 500 and 501 and between the YZ plane images 600 and 601 are larger than the predetermined rate (step ST8: No), and proceeds to the determining step ST9. When the determining section 104 of the control unit 100 of the laser processing apparatus 1-2 determines in the step ST8 that the sum calculated in the comparing step ST7 is equal to or less than the predetermined value determined in advance (step ST8: Yes), the determining section 104 ends the correcting method.

The determining section 104 of the control unit 100 of the laser processing apparatus 1-2 in the determining step ST9 calculates an aberration-including XY plane image most similar to the XY plane image 400 among the aberration-including XY plane images 701, 702, 703, 704, 705, 706, 707, 708, 709, 710, 711, 712, 713, and 714 stored in the storage section 103-2. The determining section 104, for example, performs image processing such as pattern matching on each of the aberration-including XY plane images 701, 702, 703, 704, 705, 706, 707, 708, 709, 710, 711, 712, 713, and 714 and the XY plane image 400, and calculates an aberration-including XY plane image that matches most as an aberration-including XY plane image very similar to the XY plane image 400. The determining section 104 determines the Zernike coefficient of an aberration-including XY plane image very similar to the XY plane image 400 to be an aberration as a largest difference of the XY plane image 400 from the ideal XY plane image 401. Thus, in the second embodiment, by calculating an aberration-including XY plane image most similar to the XY plane image 400 among the aberration-including XY plane images 701, 702, 703, 704, 705, 706, 707, 708, 709, 710, 711, 712, 713, and 714, the determining section 104 determines an aberration as a largest difference of the XY plane image 400 from the ideal XY plane image 401, and determines which aberration component is included in the XY plane image 400.

The determining section 104 of the control unit 100 of the laser processing apparatus 1-2 in the step ST10 changes, by a predetermined value, the value of a Zernike coefficient corresponding to the aberration component included in the aberration-including XY plane image most similar to the XY plane image 400 among the aberration-including XY plane images 701, 702, 703, 704, 705, 706, 707, 708, 709, 710, 711, 712, 713, and 714, and thereby brings the value of the Zernike coefficient close to an ideal value. Incidentally, functions of the determining section 104 are implemented by the arithmetic processing unit by performing arithmetic processing according to a computer program stored in the storage unit.

The correcting method according to the second embodiment calculates the sum of the sum total of the differences between the XZ plane image 500 and the XZ plane image 501 and the sum total of the differences between the YZ plane image 600 and the YZ plane image 601 in the comparing step ST7, and determines whether or not the above-described sum is equal to or less than the predetermined value determined in advance in the step ST8. It is therefore possible to determine easily whether or not the differences between the XZ plane images 500 and 501 and between the YZ plane images 600 and 601 are equal to or less than the predetermined rate.

In addition, the correcting method according to the second embodiment calculates an aberration-including XY plane image most similar to the XY plane image 400 among the aberration-including XY plane images 701, 702, 703, 704, 705, 706, 707, 708, 709, 710, 711, 712, 713, and 714 stored in the storage section 103-2 in the determining step ST9, and thereby determines an aberration as a largest difference of the XY plane image 400 from the ideal XY plane image 401. As a result, as in the first embodiment, the correcting method according to the second embodiment can suppress the number of man-hours necessary to correct the spot shape of the laser beam 21.

In addition, the correcting method according to the second embodiment in the step ST8 determines whether or not the above-described sum is equal to or less than the predetermined value determined in advance. It is therefore possible to determine easily whether or not the differences between the XZ plane images 500 and 501 and between the YZ plane images 600 and 601 are equal to or less than the predetermined rate. The correcting method according to the second embodiment in the determining step ST9 calculates an aberration-including XY plane image most similar to the XY plane image 400 among the aberration-including XY plane images 701, 702, 703, 704, 705, 706, 707, 708, 709, 710, 711, 712, 713, and 714, and thereby determines an aberration as a largest difference from the ideal XY plane image 401. In addition, the correcting method according to the second embodiment repeats the laser beam irradiating step ST4, the imaging step ST5, the comparing step ST7, the step ST8, the determining step ST9, and the step ST10 until it is determined in the step ST8 that the differences between the XZ plane images 500 and 501 and between the YZ plane images 600 and 601 are equal to or less than the predetermined rate. As a result, the correcting method according to the second embodiment can bring the aberration of the laser beam 21 close to the aberration of the laser beam 21 from which an ideal processing result is obtained, and can suppress a machine difference between processing apparatuses in terms of the spot shape of the laser beam 21, as in the first embodiment.

Hence, as in the first embodiment, the correcting method according to the second embodiment produces effects of being able to suppress the number of man-hours necessary to correct the spot shape of the laser beam 21 and being able to reduce a machine difference between processing apparatuses in terms of the laser beam 21 applied to the workpiece 200.

In addition, in the second embodiment of the present invention, the determining section 104 of the control unit 100 of the laser processing apparatus 1-2 may determine which aberration component is included in the XY plane image 400 by using machine learning (artificial intelligence (AI)) in the determining step ST9.

Modifications

Figure 31:
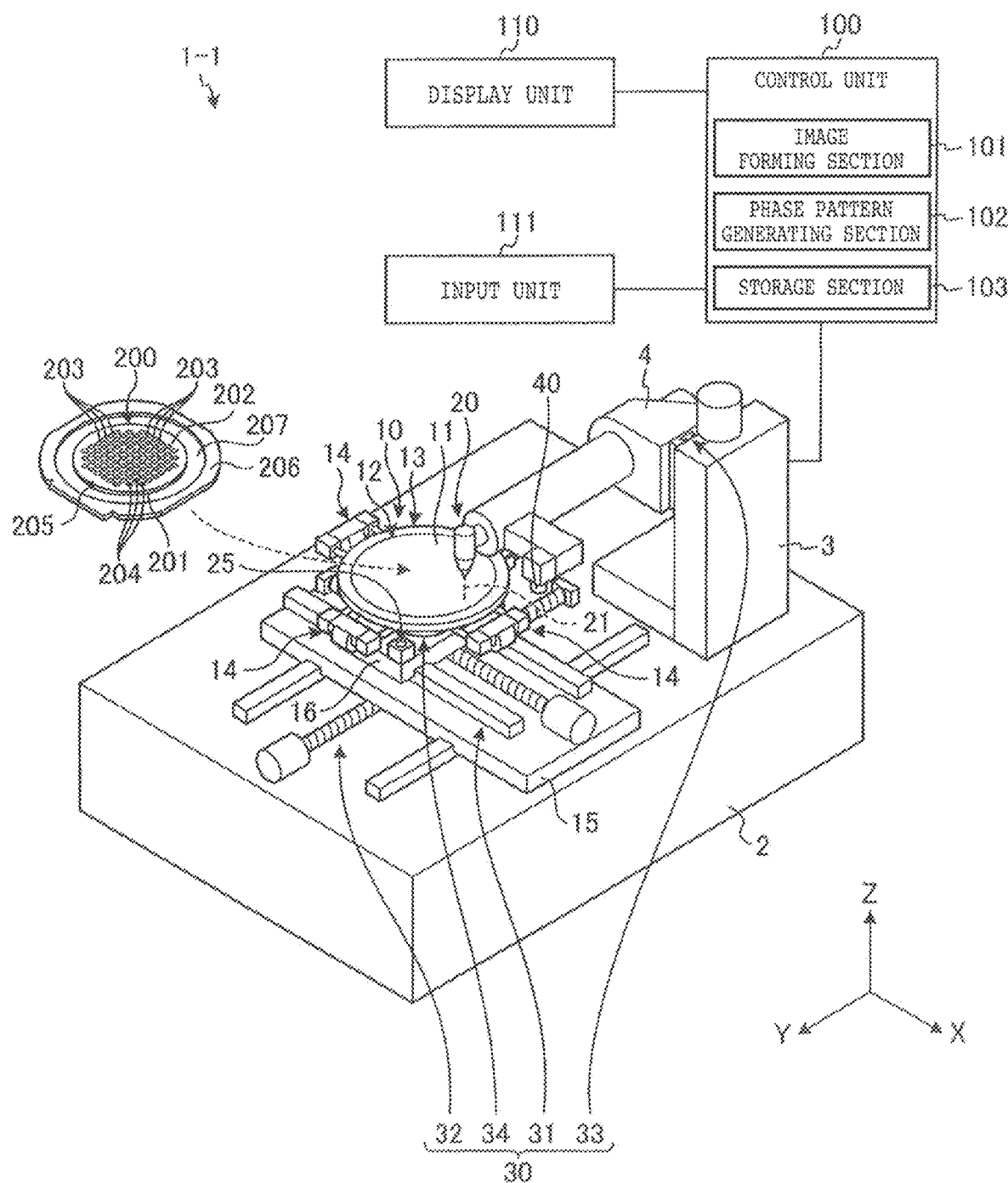
FIG. 31 is a perspective view depicting an example of a configuration of a laser processing apparatus that performs a laser beam spot shape correcting method according to a modification of the first embodiment and the second embodiment.

A laser processing apparatus according to a modification of the first embodiment and the second embodiment of the present invention will be described with reference to the drawings. FIG. 31 is a perspective view depicting an example of a configuration of a laser processing apparatus that performs a laser beam spot shape correcting method according to the modification of the first embodiment and the second embodiment. Incidentally, in FIG. 31, the same parts as in the first embodiment are identified by the same reference numerals, and description thereof will be omitted.

As depicted in FIG. 31, a laser processing apparatus 1-1 according to the modification is the same as in the first embodiment except that the concave mirror 25 is disposed in a predetermined position on the second moving plate 16 and in the concave mirror disposing step ST2, the condensing lens 23 of the laser beam irradiating unit 20 is opposed in the Z-axis direction to the reflecting surface 252 of the concave mirror 25 on the second moving plate 16.

As in the first embodiment, the laser beam spot shape correcting method according to the modification produces effects of being able to suppress the number of man-hours necessary to correct the spot shape of the laser beam 21 and being able to reduce a machine difference between processing apparatuses in terms of the laser beam 21 applied to the workpiece 200. Incidentally, in the present invention, in the laser processing apparatus 1-1 that performs the laser beam spot shape correcting method according to the modification, the image forming section 101 and the storage section 103 may have functions similar to those in the second embodiment, and the control unit 100 may include the determining section 104 as in the second embodiment.

It is to be noted that the present invention is not limited to the foregoing embodiments. That is, the present invention can be variously modified and carried out without departing from the gist of the present invention. In addition, in the present invention, in a case where the ideal XY plane image 401 of the reflected light 212 of the laser beam 21 includes a certain aberration equal to or more than a predetermined value, a method may be used which stores, in advance, XY plane images including aberrations such that differences from a Zernike coefficient corresponding to the aberration included in the ideal XY plane image 401 are a predetermined value, and compares the XY plane image 400 with the aberration-including XY plane images.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laser beam spot shape correcting method for correcting a spot shape of a laser beam condensed by a condensing lens in a laser processing apparatus, the laser processing apparatus including:
a chuck table having a holding surface a configured to hold a workpiece,
a laser beam irradiating unit configured to irradiate the workpiece held on the chuck table with the laser beam, and
a control unit,
the laser beam irradiating unit including:
a laser oscillator,
the condensing lens disposed at a position opposed to the holding surface and configured to condense the laser beam emitted from the laser oscillator, and
a spatial light modulator disposed between the laser oscillator and the condensing lens,
the method comprising:
a concave mirror disposing step of positioning a concave mirror having a reflecting surface as a spherical surface at a position facing the condensing lens of the laser beam irradiating unit;
a focal point positioning step of positioning a condensing point of the condensing lens at a focal point position of the concave mirror after the concave mirror disposing step;
a laser beam irradiating step of irradiating the concave mirror with the laser beam condensed by the condensing lens by actuating the laser oscillator;
an imaging step of imaging reflected light reflected by the reflecting surface of the concave mirror by an imaging unit;
an image forming step of forming an XZ plane image or a YZ plane image from an XY plane image depicting a shape and an intensity distribution of the laser beam imaged in the imaging step; and
a comparing step of comparing the image formed in the image forming step with an XZ plane image or a YZ plane image of a laser beam having an ideal shape and an ideal intensity distribution;

a phase pattern displayed on a display unit of the spatial light modulator being changed such that the XZ plane image or the YZ plane image formed in the image forming step coincides with the XZ plane image or the YZ plane image of the laser beam having the ideal shape and the ideal intensity distribution.

2. The laser beam spot shape correcting method according to claim 1, further comprising:
a determining step of determining which aberration component is included in the image of the laser beam imaged in the imaging step,
wherein a phase pattern that cancels out the aberration component determined in the determining step is displayed on the display unit of the spatial light modulator.

3. The laser beam spot shape correcting method according to claim 1, further comprising:
a determining step of determining which aberration component is included in the laser beam imaged in the imaging step; and
a storing step of storing, in advance, which aberration component is included in the laser beam having the ideal shape and the ideal intensity distribution,
wherein the phase pattern displayed on the display unit of the spatial light modulator is changed such that the aberration component of the laser beam imaged in the imaging step coincides with the aberration component of the ideal laser beam.

4. The laser beam spot shape correcting method according to claim 1, wherein:
in the comparing step, when a difference between the compared images is equal to or less than a predetermined rate, the difference is determined to be acceptable, and
when the difference is larger than the predetermined rate, the spot shape is corrected again.

5. The laser beam spot shape correcting method according to claim 1, wherein the concave mirror is disposed in a frame body of the chuck table.

6. The laser beam spot shape correcting method according to claim 1, wherein the concave mirror is disposed on a moving plate of a moving unit of the laser processing apparatus.

7. The laser beam spot shape correcting method according to claim 1, wherein the laser beam passes directly from the condensing lens to the concave mirror in the laser beam irradiating step.

* * * * *